US010254110B2

(12) United States Patent
Xiao et al.

(10) Patent No.: US 10,254,110 B2
(45) Date of Patent: Apr. 9, 2019

(54) VIA CHARACTERIZATION FOR BCD AND DEPTH METROLOGY

(71) Applicant: Nanometrics Incorporated, Milpitas, CA (US)

(72) Inventors: Ke Xiao, Hillsboro, OR (US); Brennan Peterson, Veldhoeven (NL); Timothy A. Johnson, Tigard, OR (US)

(73) Assignee: Nanometrics Incorporated, Milpitas, CA (US)

( * ) Notice: Subject to any disclaimer, the term of this patent is extended or adjusted under 35 U.S.C. 154(b) by 0 days.

(21) Appl. No.: 14/571,099

(22) Filed: Dec. 15, 2014

(65) Prior Publication Data
US 2015/0168128 A1 Jun. 18, 2015

Related U.S. Application Data

(60) Provisional application No. 61/917,780, filed on Dec. 18, 2013.

(51) Int. Cl.
*G01B 11/22* (2006.01)
*G01B 11/06* (2006.01)
*H01L 21/66* (2006.01)

(52) U.S. Cl.
CPC .......... *G01B 11/22* (2013.01); *G01B 11/0608* (2013.01); *H01L 22/12* (2013.01); *G01B 2210/56* (2013.01); *H01L 22/20* (2013.01)

(58) Field of Classification Search
CPC .................................................. G01B 11/02
(Continued)

(56) References Cited

U.S. PATENT DOCUMENTS 5,087,121 A * 2/1992 Kakuchi ............... G01B 11/22
356/626
5,376,790 A * 12/1994 Linker ................... G01Q 10/04
250/307
(Continued)

FOREIGN PATENT DOCUMENTS

TW 201305529 2/2013
WO WO 2012/077652 A1 6/2012
(Continued)

OTHER PUBLICATIONS

International Search Report and Written Opinion dated Jun. 10, 2015 for International Application No. PCT/US2014/070673 filed on Dec. 16, 2014 by Nanometrics Incorporated, 13 pages.
(Continued)

*Primary Examiner* — Tarifur Chowdhury
*Assistant Examiner* — Omar Nixon
(74) *Attorney, Agent, or Firm* — Silicon Valley Patent Group LLP

(57) ABSTRACT

An optical metrology device determines physical characteristics of at least one via in a sample, such as a through-silicon vias (TSV), using signal strength data for modeling of the bottom critical dimension (BCD) and/or for refinement of the data used to determine a physical characteristic of the via, such as BCD and/or depth. The metrology device obtains interferometric data and generates height and signal strength data, from which statistical properties may be obtained. The height and signal strength data for the via is refined by removing noise using the statistical property, and the BCD for the via may be determined using the refined height and signal strength data. In one implementation, a signal strength via map for a via is generated using signal strength data and is fit to a model to determine the BCD for the via.

37 Claims, 16 Drawing Sheets

(58) Field of Classification Search
USPC .................................................. 356/496
See application file for complete search history.

(56) References Cited

U.S. PATENT DOCUMENTS

| | | | | |
|---|---|---|---|---|
| 5,392,118 | A * | 2/1995 | Wickramasinghe | G01B 11/22 356/496 |
| 5,398,113 | A | 3/1995 | De Groot | |
| 5,448,399 | A * | 9/1995 | Park | G01Q 20/02 359/227 |
| 5,960,107 | A * | 9/1999 | Leroux | G01B 11/22 356/618 |
| 6,057,547 | A * | 5/2000 | Park | B82Y 35/00 850/10 |
| 8,126,677 | B2 * | 2/2012 | De Groot | G01B 11/06 356/512 |
| 2003/0079983 | A1 * | 5/2003 | Long | H01J 37/32082 204/164 |
| 2004/0032593 | A1 * | 2/2004 | Venugopal | G01B 11/0625 356/504 |
| 2006/0061773 | A1 * | 3/2006 | Lee | G01B 11/2441 356/511 |
| 2006/0285122 | A1 * | 12/2006 | Bankhead | G01B 11/30 356/511 |
| 2007/0148792 | A1 * | 6/2007 | Marx | H01L 22/12 438/14 |
| 2009/0128827 | A1 * | 5/2009 | de Groot | G02B 21/0004 356/495 |
| 2009/0182528 | A1 * | 7/2009 | De Groot | G01B 11/06 702/167 |
| 2009/0319225 | A1 * | 12/2009 | Mansfield | G01B 11/0675 702/170 |
| 2010/0165354 | A1 * | 7/2010 | Sakai | G02B 5/201 356/503 |
| 2011/0296561 | A1 * | 12/2011 | Humphris | B82Y 35/00 850/4 |
| 2012/0004888 | A1 * | 1/2012 | Mansfield | G01B 9/04 702/166 |
| 2012/0140243 | A1 * | 6/2012 | Colonna de Lega | A61F 9/00836 356/609 |
| 2012/0257213 | A1 * | 10/2012 | Schonleber | G01B 11/22 356/485 |
| 2012/0271591 | A1 * | 10/2012 | Kamenev | G01B 11/0675 702/167 |

FOREIGN PATENT DOCUMENTS

| | | |
|---|---|---|
| WO | WO 2013/011508 A2 | 1/2013 |
| WO | WO 2013/121423 A1 | 8/2013 |

OTHER PUBLICATIONS

Invitation to Pay Additional Fees dated Mar. 10, 2015 for International Application No. PCT/US2014/070673 filed on Dec. 16, 2014 by Nanometrics Incorporated, 6 pages.

Ahn et al. (Mar. 9, 2012). "Defect distribution study at through silicon via (TSV) bottom by scanning white-light interference microscopy," *Proceedings of SPIE* 8324:IU-1-IU-6.

Restle et al. (Apr. 2004). "Nonparametric smoothing of interferometric height maps using confidence values," *Optical Engineering* 43(4):866-871.

Timoney et al. (May 19, 2014). "New interferometric measurement technique for small diameter TSV," 25$^{th}$ Annual Semi Advanced Semiconductor Manufacturing Conference (ASMC 2014), *IEEE* p. 37-41.

* cited by examiner

VIA CHARACTERIZATION FOR BCD AND DEPTH METROLOGY

CROSS-REFERENCE TO RELATED APPLICATION(S)

This application claims priority under 35 USC 119 to U.S. Provisional Application No. 61/917,780, filed Dec. 18, 2013, and entitled "Via Characterization For BCD And Depth Metrology," which is incorporated herein by reference in its entirety.

FIELD OF THE INVENTION

The present invention is related to optical metrology, and more particularly to optical metrology to determine physical characteristics of one or more vias in a sample.

BACKGROUND

During processing of substrates, such as semiconductor substrates, vias are sometimes produced for electrical connections between layers in an electrical circuit. A via (sometimes referred to as a Vertical Interconnect Access) are typically small openings in an insulating layer which may be used as a conductive connection between layers on either side of the insulating layer. One type of via is a through-silicon via (TSV), which is a vertical electrical connection that passes through a silicon wafer or die, and may be used, e.g., to produce 3D integrated circuits or packages.

The physical characteristics of the vias produced during manufacturing can affect device performance and reliability. Physical characteristics of vias that may affect performance include depth and one or more critical dimension or shape of the via (and in particular the bottom surface of the via), which may be, e.g., circularity, ellipticity, bottom radius or radii (or equivalently diameter) curvature, x/y dimension, shape, sidewall angle, roughness, etc., sometimes generally referred to herein as bottom critical dimension (BCD). Thus, it is desirable to measure the physical characteristics of vias during the manufacture process.

One technique used to measure the physical characteristics of vias is optical metrology. However, the low signal-to-noise ratio of optical measurements from the via bottom makes detection and accurate measurement of the BCD and depth difficult, particularly for small vias, e.g., with diameters of approximate 5 µm or less and/or with high-aspect ratios (depth:diameter is approximately 15:1 or greater). As electronic devices continue to decrease in size, the diameter of vias continues to shrink, and the aspect ratios continue to increase, making accurate measurement of the physical characteristics of vias more difficult.

SUMMARY

An optical metrology device determines physical characteristics of at least one via in a sample, such as a through-silicon vias (TSV), using signal strength data for modeling of the bottom critical dimension (BCD) and/or for refinement of the data used to determine a physical characteristic of the via, such as BCD and/or depth. The metrology device obtains interferometric data and generates height and signal strength data, from which statistical properties may be obtained. The height and signal strength data for the via is refined by removing noise using the statistical property, and the BCD for the via may be determined using the refined height and signal strength data. In one implementation, a signal strength via map for a via may be generated using signal strength data and fit to a model to determine the BCD for that via.

In one implementation, a method of determining a physical characteristic of at least one via in a sample includes obtaining interferometric data from the sample; generating height and signal strength data from the interferometric data; detecting a location of each via to be measured on the sample; determining a statistical property of the height and signal strength data for a via; producing refined height and signal strength data for the via by removing noise in the height and signal strength data for the via using the statistical property; and using the refined height and signal strength data to determine the physical characteristic for the via.

In one implementation, a method of determining a physical characteristic of at least one via in a sample includes obtaining interferometric data from the sample; generating height and signal strength data from the interferometric data; detecting a location of each via to be measured on the sample; generating a signal strength via map for a via based on the signal strength data and the location of the via, wherein the signal strength via map includes signal strength data for only one via; fitting the signal strength via map to a model to determine a bottom critical dimensions (BCD) for the via.

In one implementation, a method of determining a physical characteristic of at least one via in a sample includes obtaining interferometric data from the sample; generating height and signal strength data from the interferometric data; detecting a location of each via to be measured on the sample; generating a statistical property of the height and signal strength data for a via; producing refined height and signal strength data for the via by removing noise in the height and signal strength data for the via using the statistical property; generating a signal strength via map for the via based on the refined height and signal strength data, wherein the signal strength via map includes signal strength data for only one via; and determining a physical characteristic for the via using the signal strength via map.

DETAILED DESCRIPTION

Figure 1:
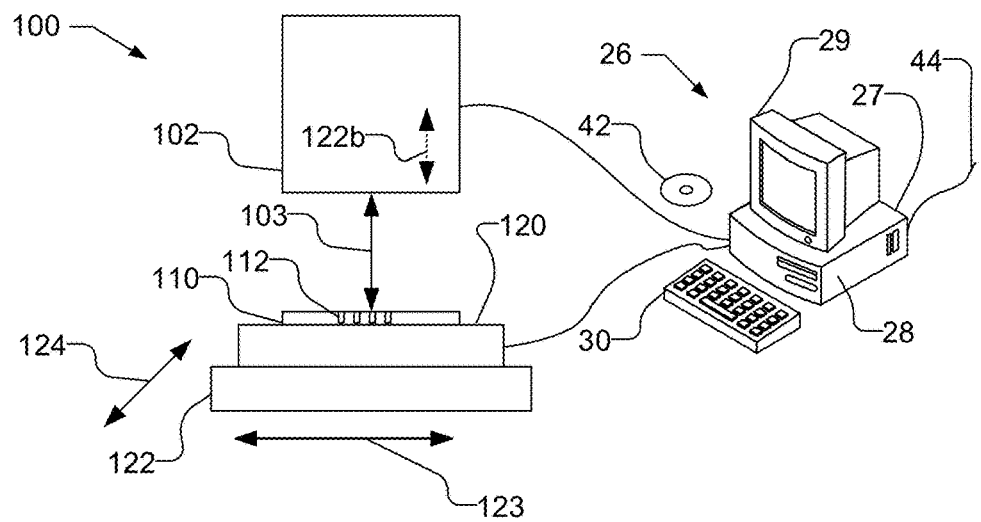
FIG. 1 shows a schematic view of a metrology device that may be used to determine physical characteristics of vias in a sample.

FIG. 1 shows a schematic view of an optical metrology device 100 that may be used to measure the physical characteristics of vias 112 in a sample 110, such as a through-silicon vias (TSV), using signal strength data, e.g., for modeling of the critical dimensions or shape of the via, such as bottom critical dimension (BCD) and/or for refinement of the data used to determine critical dimensions or shape of the via and/or depth, as discussed herein. The metrology device 100 includes chuck 120 mounted on a stage 122. The stage 122 may be capable of horizontal motion in either Cartesian (i.e., X and Y) coordinates, as indicated by arrows 123 and 124, or Polar (i.e., R and θ) coordinates or some combination of the two. The stage may also be capable of vertical motion.

Metrology device 100 includes an optical head 102 that is coupled to a computer 26, such as a workstation, a personal computer, central processing unit or other adequate computer system, or multiple systems. If desired, multiple optical heads, i.e., different metrology devices, may be combined in the same metrology device 100. The computer 26 may control the movement of the stage 122 and optical head 102, as well as control the operation of the chuck 120. In one embodiment, the chuck 120 may be held stationary while the optics move relative to the substrate 110 or both may move relative to the other. For example, the optical head 102 or a portion of the optical head 102, e.g., an objective lens, may be movable in the vertical direction, as indicated by arrow 122b. If desired, in addition to, or as an alternative to, the horizontal motion of the stage 122, the optical head 102 or a portion of the optical head 102 may be capable of horizontal motion with respect to the sample 110 to produce relative lateral movement between optical head and the sample.

Figure 2:
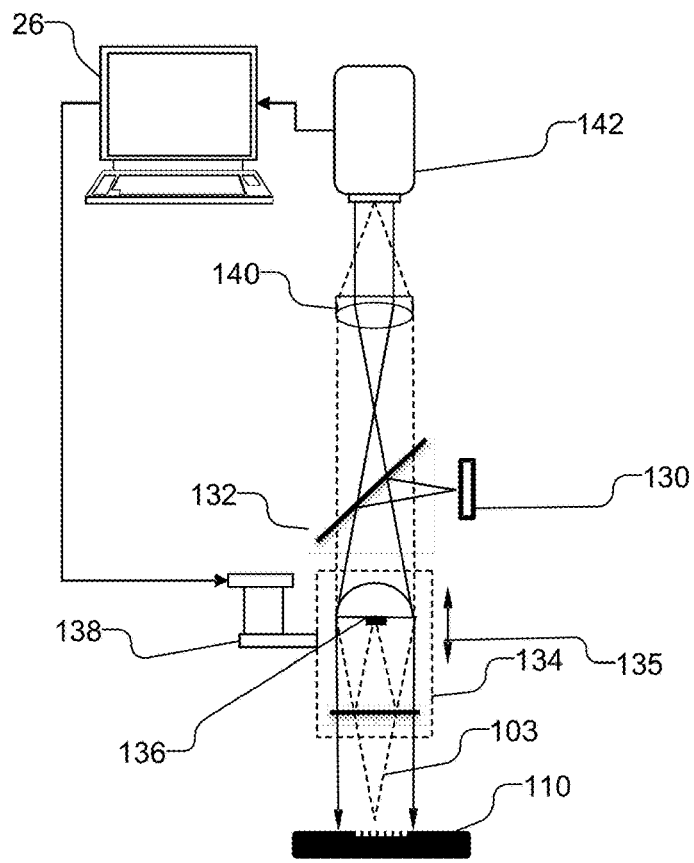
FIG. 2 illustrates a white light interferometer, which may be used as the metrology device of FIG. 1.

In one embodiment, the optical head 102 may be white light interferometer 102. FIG. 2 illustrates a block diagram of a white light interferometer 102. Interferometer 102 includes a broadband light source 130 and a beam splitter 132. Light from the beam splitter 132 is reflected towards an interference objective 134, which includes a reference mirror 136. The interference objective 134 is coupled to an actuator 138, which is controlled by computer 26, to adjust the vertical position of the interference objective 134. The interference objective produces beams 103 that are incident on and reflect from the substrate 110, passes back through the interference objective 134 and beam splitter 132 and focused by imaging lens 140 onto detector 142, which is coupled to the computer 26.

Figure 3A:
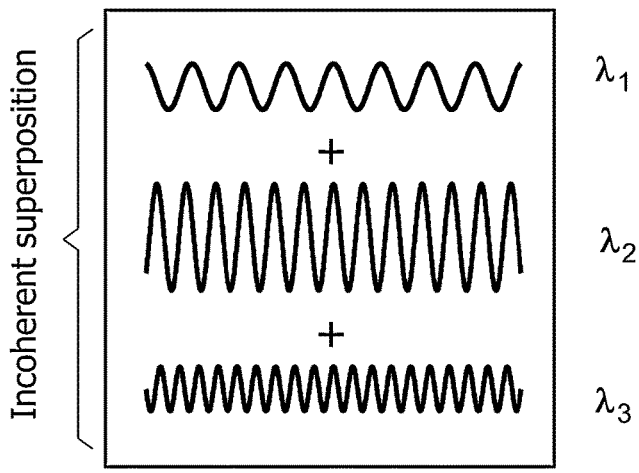
FIG. 3A illustrates the incoherent superposition of three wavelengths.
Figure 3B:
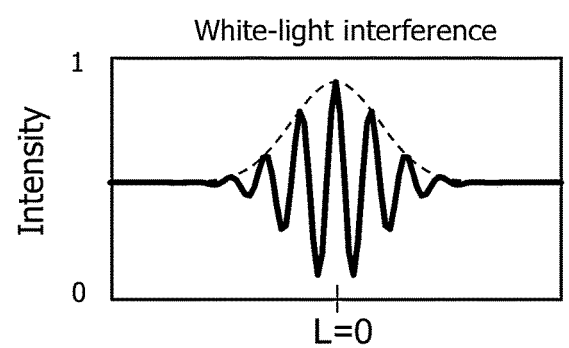
FIG. 3B illustrates the measured intensity of the combined wavelengths of light from FIG. 3A.
Figure 4A:
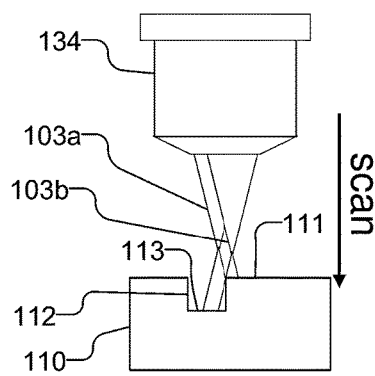
FIG. 4A illustrates measuring multiple locations on the substrate.
Figure 4B:
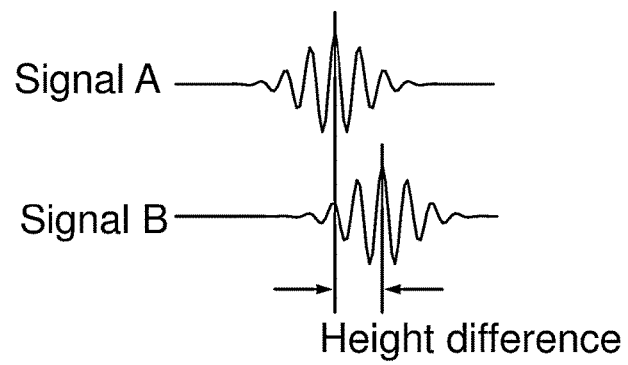
FIG. 4B illustrates determining a height difference based on detected intensity signals for different pixels.

In operation, the white light interferometer 102 scans the interference objective 134 perpendicular to the surface of the sample 110, as indicated by the arrow 135 collecting interference patterns in the image plane. White light interference is the superposition of multiple wavelength interference patterns, as illustrated in FIGS. 3A and 3B. FIG. 3A, for example, illustrates the incoherent superposition of three wavelengths $\lambda_1$, $\lambda_2$, and $\lambda_3$. FIG. 3B illustrates the measured intensity of the light from FIG. 3A combined at a single pixel in detector 142, where the vertical axis represents intensity and the horizontal axis represents the Z position (i.e., height) from the surface of the substrate 110. The signal generated in this manner is referred to as a scanning white light interferometry (SWLI) signal. When the peaks for the wavelengths are equal and all patterns have a common phase, the surface is detected (L=0). By measuring multiple locations in the illumination spot, i.e., by detecting intensity signals for different pixels in detector 142, the height difference at the different locations can be determined. For example, FIG. 4A illustrates beamlets 103a and 103b of the illumination spot from interference objective 134 and that are incident at different locations the sample 110. By detecting the intensity signals for the pixels in detector 142 associated with beamlets 103a and 103b, the height difference between the locations upon which beamlets 103a and 103b are incident can be determined. FIG. 4B illustrates, for example, a comparison of the Signal A, e.g., from beamlet 103a, and a Signal B, e.g., from beamlet 103b, where the difference between the intensity of Signal A and Signal B is directly related to the height difference between the locations upon which beamlets 103a and 103b are incident. By scanning the interference objective 134 perpendicular to the surface of the substrate 110, the topography of a surface of the substrate 110 can be mapped as a three-dimensional image. For example, the interference objective 134 may be scanned perpendicular to the top surface 111 of the substrate 110, to map the topography of the top surface 111 of the sample, and may be scanned a second time, perpendicular to the bottom surface 113 of the vias 112, to map the topography of the bottom surface 113 of the vias 112. The beam 103 may be positioned over a different area of the sample 110, e.g., by producing relative movement between the sample 110 and at least a portion of the optical head, and the process repeated to map additional areas of the sample 110 as a three-dimensional image. White light interferometer 102 and its general operation are described in more detail in U.S. Pat. No. 5,398,113, which is incorporated herein by reference in its entirety.

While a white light interferometer 102 is described herein as providing the physical characteristics of the vias in the sample, including BCD and/or depth, it should be understood that other types of metrology devices alone or in combination can be used to characterize the physical characteristics of the vias in the sample, including BCD and/or depth, as described herein. For example, metrology devices, such as confocal microscopes, reflectometers, ellipsometers, or other interferometers, including shear interferometers, may be used alone or in some combination within metrology device 100.

Referring back to FIG. 1, the computer 26 controls the stage 122 and optical head 102. The computer 26 also collects and analyzes the data from the optical head 102 to determine the physical characteristics of the vias in the sample, including BCD and/or depth. A computer 26 is preferably included in, or is connected to or otherwise associated with optical head 102 for processing data detected by the optical head 102. The computer 26, which includes a processor 27 with memory 28, as well as a user interface including e.g., a display 29 and input devices 30. A non-transitory computer-usable storage medium 42 having computer-readable program code embodied may be used by the computer 26 for causing the processor to control the metrology device 100 and to perform the functions including the analysis described herein for using signal strength data to model the bottom critical dimension (BCD) and/or for refinement of the data used to determine BCD and/or depth for one or more vias. The data structures and software code for automatically implementing one or more acts described in this detailed description can be implemented by one of ordinary skill in the art in light of the present disclosure and stored, e.g., on a computer readable storage medium 42, which may be any device or medium that can store code and/or data for use by a computer system such as processor 27. The computer-usable storage medium 42 may be, but is not limited to, magnetic and optical storage devices such as disk drives, magnetic tape, compact discs, and DVDs (digital versatile discs or digital video discs). A communication port 44 may also be used to receive instructions that are used to program the computer 26 to perform any one or more of the functions described herein and may represent any type of communication connection, such as to the internet or any other computer network. Additionally, the functions described herein may be embodied in whole or in part within the circuitry of an application specific integrated circuit (ASIC) or a programmable logic device (PLD), and the functions may be embodied in a computer understandable descriptor language which may be used to create an ASIC or PLD that operates as herein described.

Figure 5:
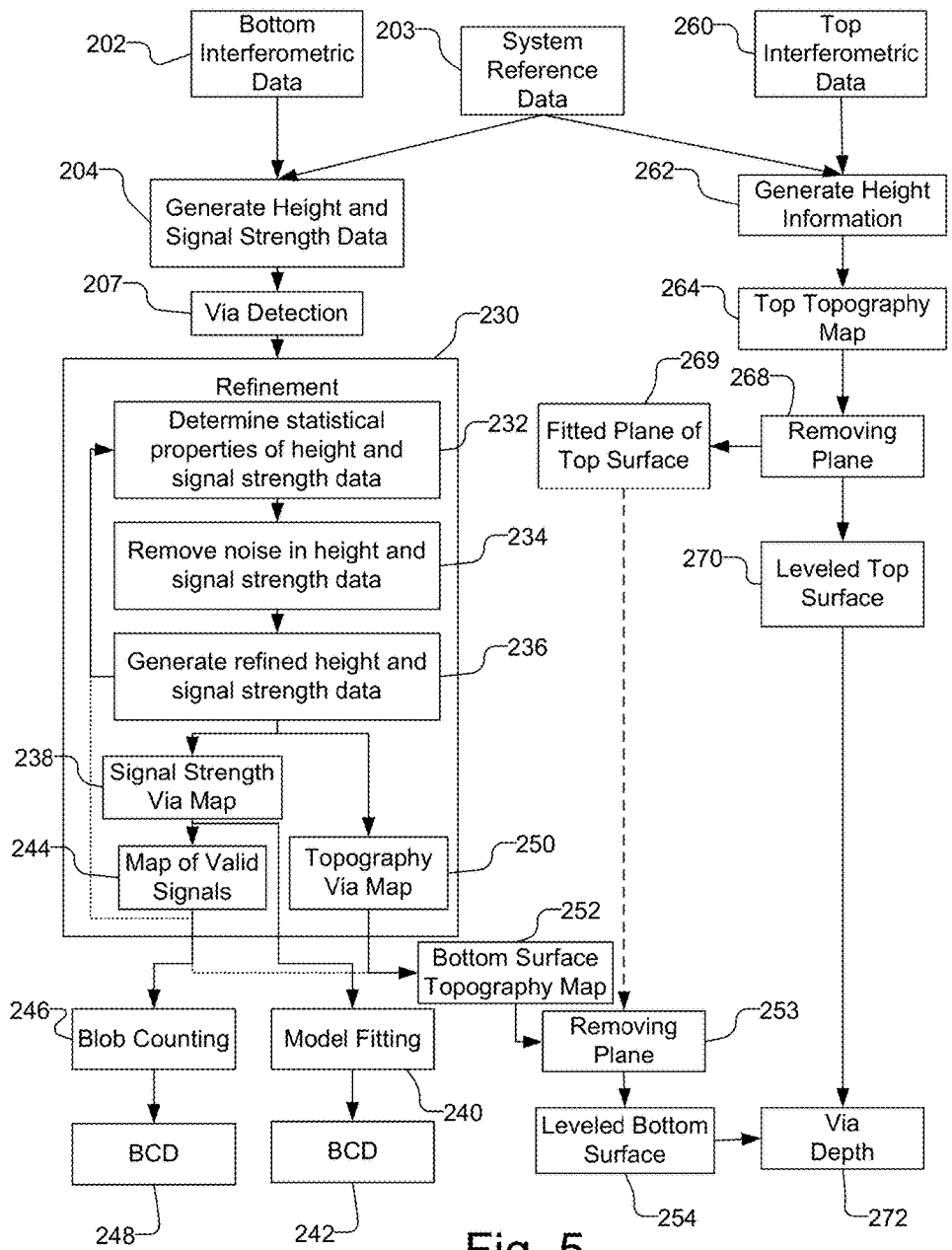
FIG. 5 is a flow chart illustrating a process to determine physical characteristics of the vias in the sample, such as BCD and/or depth.

FIG. 5 is a flow chart illustrating a process that may be performed by metrology device 100 to determine physical characteristics of the vias in the sample, such as BCD and/or depth, in which signal strength data is used, e.g., for modeling of the BCD and/or for refinement of the data used to determine BCD and/or depth. The signal strength data provides information that may be used to identify whether a response in the data is from a valid signal or only from noise, which is particularly advantageous for vias and for samples with a low signal-to-noise ratio. Thus, the data may be refined to exclude or minimize portions of the data that are not part of the valid signal, and the BCD and/or depth may be determined using the refined data. Further, the signal strength data may be used, along with a model, to fit the BCD.

As illustrated in FIG. 5, interferometric data is obtained from the sample 202, 260. The interferometric data may be for the bottom surface of the vias, i.e., bottom interferometric data 202 and for the top surface of the sample, i.e., top interferometric data 260. The interferometric data may be obtained, using a SWLI metrology device such as that shown in FIG. 2, or other appropriate metrology device, and thus, may include an intensity vs. height signal for each pixel in the detector, e.g., covering a frame of view of the sample or the entire sample. The interferometric data may be processed, e.g., by a windowed-bandpass filter to remove low and high frequency noise on a pixel-to-pixel basis. Height and signal strength data 204 is generated from the bottom interferometric data 202. The height and signal strength data may be generated from the interferometric data in any desired manner. For example, the surface height can be determined from the location of the maximum modulation of the interferometric signal, or by equivalent means, such as described in U.S. Pat. No. 5,398,113, which is incorporated herein by reference in its entirety.

The signal strength is a measure of the intensity of the interferometric signal. For example, the signal strength may be determined from the maximum and the minimum of the modulation. In another method, the interferometric data 202 may be correlated with a characteristic response function 203 to extract the signal strength. In yet another method, the signal strength can be determined from the maximum of the power spectrum of the signal. Alternatively, by fitting a theoretical representative signal stored in the system reference data 203 to the experimental interferometric data 202, a fitting merit function may be obtained, whose value represents the signal strength. Other method for extracting the signal strength will be readily apparent to those of ordinary skill in the art.

Figure 6:
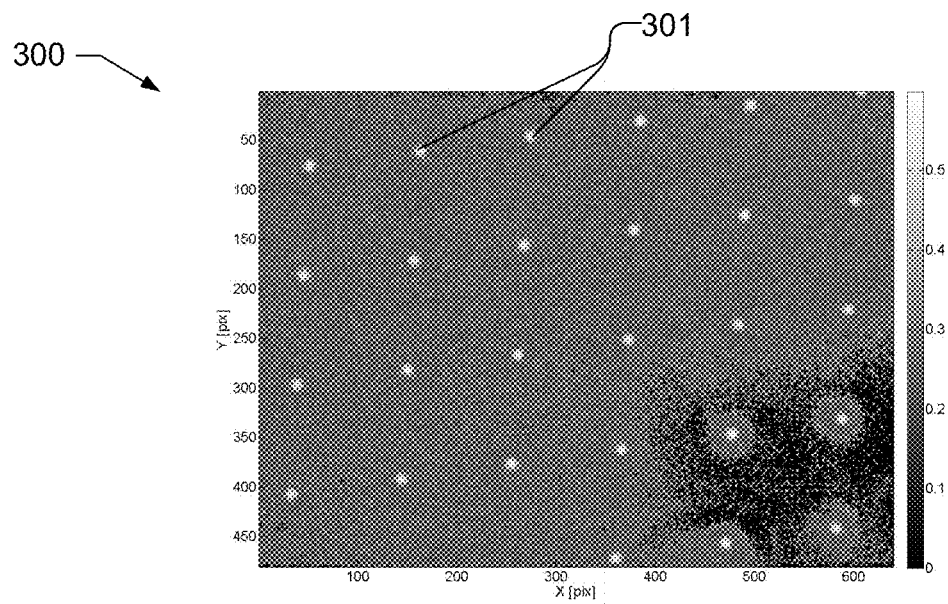
FIG. 6 illustrates a signal strength sample map for the sample
Figure 7:
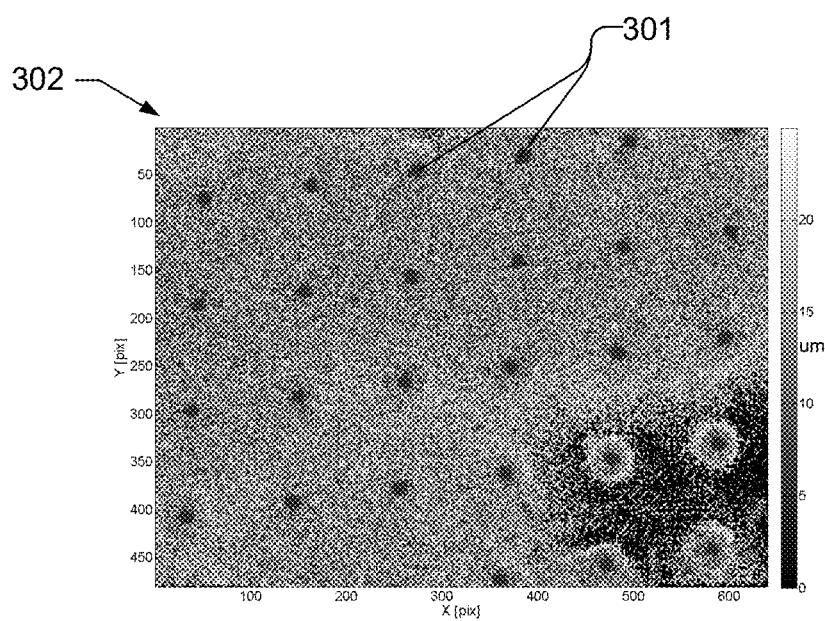
FIG. 7 is a topography sample map for the sample.

The location of each via on the sample is detected 207. The location of a via may be detected, e.g., by applying pattern location techniques to a sample map, the intensity of which is the height information from the height data, the signal strength data, or the reflected intensity data, or any other appropriate parameter derived from analysis of the interferometric data. The method may use the parameter with least uncertainty at this point in the analysis. FIG. 6, by way of example, illustrates a signal strength sample map 300 for a frame of view of a sample that includes a number of vias 301. The location of each via area in the signal strength sample map may be detected, e.g., by comparing the signal strength sample map to a threshold to find the location and values of peak intensities, which correlate to the via areas. Alternatively, if desired, a topography sample map may be generated using the height information data, i.e., for the field of view of the sample. FIG. 7, by way of example, illustrates a topography sample map 302 produced using the height data for a frame of view of a sample that includes the vias 301. The location of each via area in the topography sample map may be detected, e.g., by comparing the topography sample map to a threshold to find the location and values of peak height, which correlate to the via areas. Alternatively, an optical image of the sample may be used to detect the location of each via.

A refinement process 230 is used to refine the height and signal strength data associated with each via to be measured, i.e., every via or a subset of the vias (including only a single via) on the sample or in the frame of view to be measured. In general, the refinement process 230 refines the height and signal strength data for a via based on an analysis of a statistical property of signal strength values of all pixels that identifies the portion of the height and signal strength data that is associated with valid signals. For example, as illustrated in FIG. 5, a statistical property of the height and signal strength data may be determined 232. The statistical property may be, e.g., the average height for all pixels in one or more of the vias being measured. Noise in the height and signal strength data may be removed 234 using the statistical property and refined height and signal strength data may be generated 236. The noise in the height and signal strength data may be removed, e.g., using a confidence window that is convolved with the height and signal strength data using the statistical property. For example, the confidence window may be centered on the average height in the interferometric data or on the height and signal strength data.

Figure 8A:
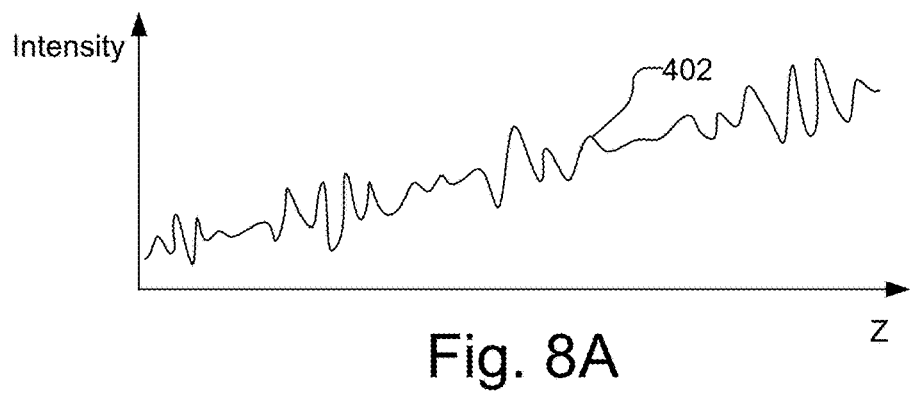
FIGS. 8A and 8B respectively illustrate interferometric data and height and signal strength data that may be generated from the interferometric data.
Figure 8B:
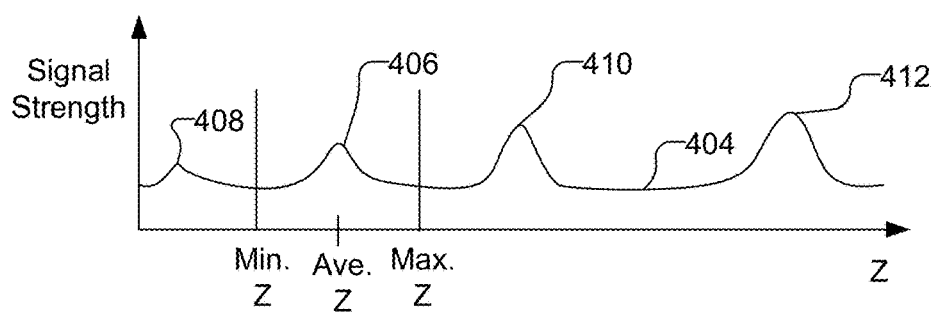

By way of example, FIG. 8A illustrates an example of interferometric data 402 (height (Z) versus intensity) for a single pixel in a via and FIG. 8B illustrates the height and signal strength data 404 that may be generated from the interferometric data 402. As can be seen in the height and signal strength data 404, more than one peak may be present in the height and signal strength data 404. In the present example, peak 406 is, in fact, near the true height of the pixel, while peaks 408, 410, and 412 are not near the true height of the pixel. Moreover, peaks 410 and 412 may have greater signal strength than the correct peak 406. Thus, reliance on only the signal strength to determine the height of the pixel will produce an incorrect height value for the pixel.

In the refinement process 230, a statistical property of the height and signal strength data is determined. For example, an average height (Ave. Z) may be determined using the height and signal strength data for a plurality of pixels. In one implementation, the statistical property, such as average height may be modeled. In another implementation, the average height may be determined by summing the height and signal strength data for a plurality of pixels. In the height and signal strength data for each pixel, a peak (e.g., peak 406 in FIG. 8B) will be present near the average height. Other peaks may be present in the height and signal strength data for each pixel (e.g., peaks 408, 410 and 412 in FIG. 8B), but these other peaks will be at different heights from one pixel to the next. Consequently, a summation of the height and signal strength data for a plurality of pixels will result in a large peak that identifies the average height (Ave. Z) for the via. Additional or alternative statistical properties, such as the minimum height (Min. Z) and maximum height (Max Z), may be used in a similar or different manner.

Figure 9A:
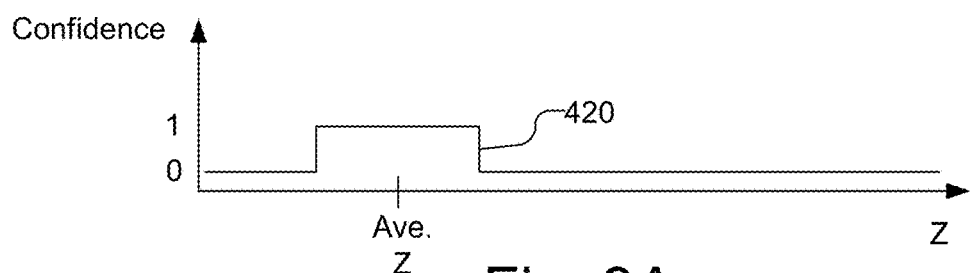
FIGS. 9A and 9B illustrate different confidence windows.
Figure 9B:
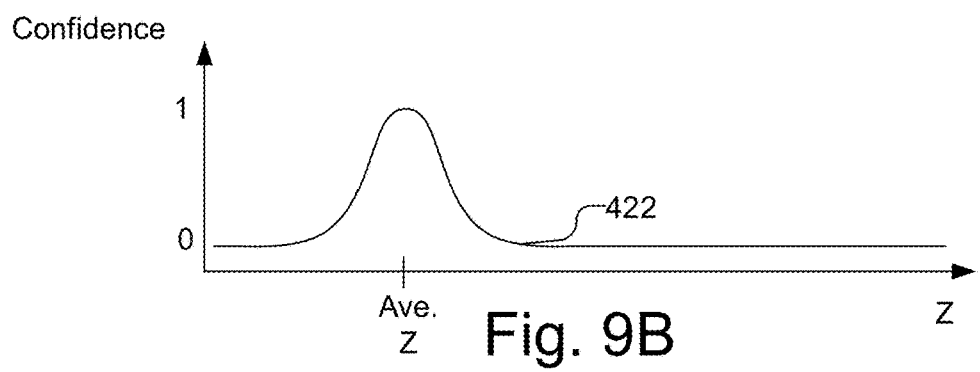
Figure 10A:
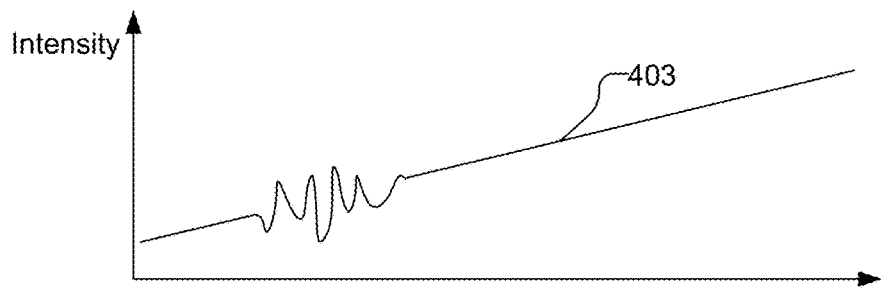
FIGS. 10A and 10B respectively illustrate interferometric data and height and signal strength data convolved with a confidence window.
Figure 10B:
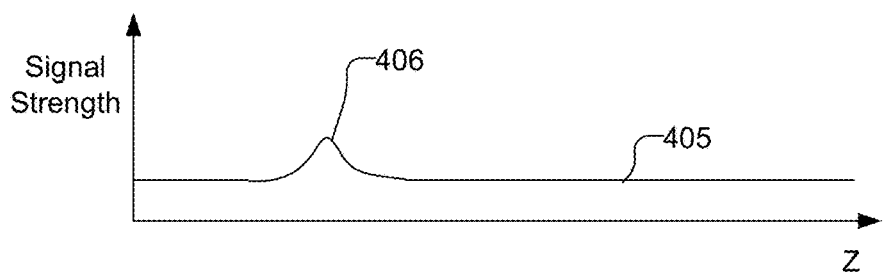

The peaks 408, 410, and 412 are not near the average height (e.g., not within the minimum or maximum height of the via) and thus, peaks 408, 410, and 412 may be considered noise (or the result of noise in the interferometric data 402). With the desired statistical property determined, noise in the height and signal strength data may be removed, e.g., using a confidence window. FIG. 9A, by way of example, illustrates a confidence window 420 that has a boxcar function. The width of the confidence window 420 may be, e.g., a predetermined fixed width or may be determined based on the statistical properties of the height and signal strength data from the plurality of pixels, such as the minimum and maximum height or a width may be set to 3 sigma by fitting a smooth confidence function to a Gaussian shape. FIG. 9B illustrates another implementation of a confidence window 422 with a smoothly varying function, e.g., a normal distribution, again which may be predetermined or based on statistical properties of the height and signal strength data from the plurality of pixels. The confidence window may be based on other functions, such as a triangle function, or, e.g., a distribution that reflects an expected curvature of the bottom surface (which would affect the height distribution). Other functions may be used for the confidence window as will be readily apparent to those of ordinary skill in the art in light of the present disclosure. The noise in the height and signal strength data for the via is removed by producing a convolution of the confidence window with the height and signal strength data for the via based on the statistical property. For example, a confidence window centered on the average height (or located from the minimum height to maximum height, etc.) may be convolved with either the interferometric data 402 or the height and signal strength data 404 for the via. Thus, in one implementation, the confidence window may be convolved with the interferometric data to produce refined interferometric data. FIG. 10A, for example, illustrates the interferometric data 402 from FIG. 8A convolved with a confidence window having a boxcar function, to produce refined interferometric data 403. The refined height and signal strength data 405, illustrated in FIG. 10B for the via may then be generated from the refined interferometric data 403, and as illustrated the peak 406 remains, while the noise (peaks 408, 410, and 412 are removed). Alternatively, the confidence window may be convolved with the height and signal strength data 404 to produce the refined height and signal strength data 405 directly, and thus, the step of removing noise in height and signal strength data 234 and generating refined height and signal strength data 236 in FIG. 5 may be performed simultaneously.

As illustrated in FIG. 5, if desired, multiple iterations of the refinement process may be performed. Thus, the statistical properties of the height and signal strength data may be determined and the refined height and signal strength data generated until no further improvements are obtained or for a set number of iterations.

Figure 11:
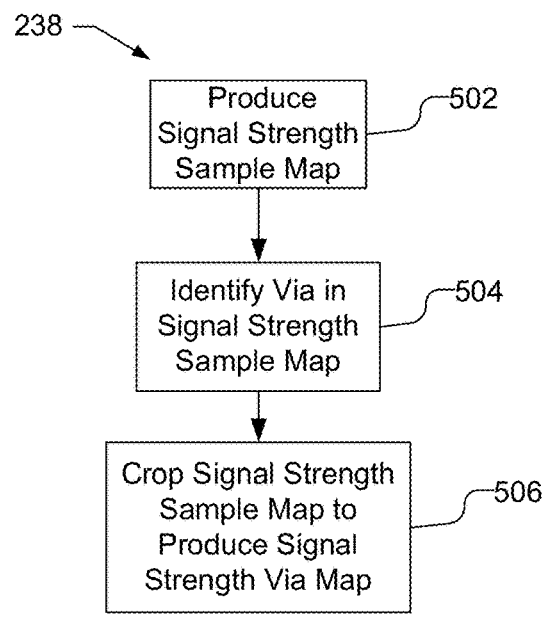
FIG. 11 is a flow chart illustrating a method of generating the signal strength via map.
Figure 12:
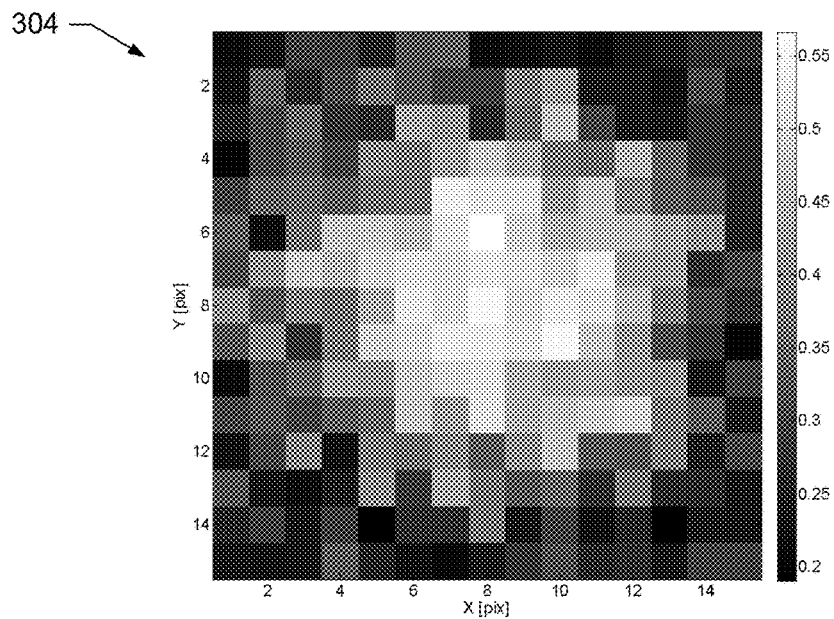
FIG. 12 illustrates a signal strength via map for an individual via.

The signal strength data in the height and signal strength data for the via is sensitive to actual signal and noise, and thus may be used to distinguish the actual signal from noise, which may be used to determine the BCD. A signal strength via map 238 for the via may be generated using the refined height and signal strength data, wherein the signal strength via map 238 includes signal strength information for only one via. The signal strength via map 238 for the via to be measured may be generated based on the signal strength data in the refined height and signal strength data, e.g., by cropping a signal strength sample map for the sample. For example, as illustrated in FIG. 11, a method of generating the signal strength via map 238 may include producing a signal strength sample map 502 for the frame of view of the sample or the entire sample using the height information from the refined height and signal strength data. FIG. 6, by way of example, illustrates a signal strength sample map 300. The via is identified in the signal strength sample map 504, e.g., using the location determined during via detection 207, and the via is cropped from the signal strength sample map to generate the signal strength via map for the via 506. FIG. 12, by way of example, illustrates a signal strength via map 304 for one via. As can be seen in FIG. 12, the signal strength via map 304 may include some pixels surrounding the via to ensure the entire detected via is included in the signal strength via map. Thus, for example, if the signal strength via map is generated by cropping the signal strength sample map, pixels surrounding detected peak intensities may be included to ensure the entire detected via is included in the signal strength via map. It should be understood that a signal strength via map is produced for each via to be measured, which may be all the vias on the sample, all the vias in the frame of view, or a subset of vias including a single via.

The signal strength via map for each via to be measured may be used to determine the BCD 242 for each via using model fitting 240. Model fitting 240 fits the signal strength via map for a via to a model to determine the BCD 242 for that via. If desired, a weighted fitting may be used, in which the signal from the central area of the bottom may have more weight during the fitting, and the background noise area around the bottom area may have less weight. The model models the strength as function of position on the bottom surface of the via. By way of example, the function in equation 1 is one possible model found empirically to describe the signal strength profile from a via bottom in real signals well. Other models may be used effectively in place of equations 1 and 2, as will be apparent to those of ordinary skill in the art.

$$f(r) = \begin{cases} I_0 \left[ \dfrac{\sin\left(\pi \left|\dfrac{r}{R_{BCD}}\right|^p\right)}{\left(\pi \left|\dfrac{r}{R_{BCD}}\right|^p\right)} \right]^m, & (r \le R_{BCD}) \\ \text{Constant}, & (r > R_{BCD}) \end{cases} \quad \text{eq. 1}$$

Where the power factor m may be any desired power, e.g., 2, the power factor p is a function of the optical resolution of the system ($L_{opt}$) and the radius of the BCD ($R_{BCD}$), the smooth function of p is:

$$p = \left[\left(\dfrac{R_{BCD}}{L_{opt}}\right)^n + 1\right]^{\frac{1}{n}} (n \ge 2) \quad \text{eq. 2}$$

The fitting parameters are $I_0$, $R_{BCD}$, and Constant, where $R_{BCD}$ is the fitted BCD radius for the via.

Figure 15:
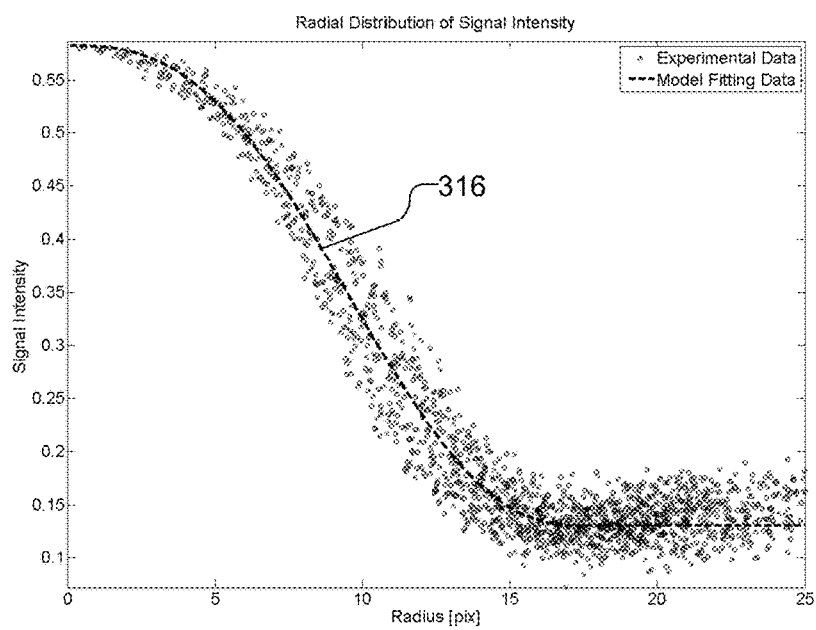
FIG. 15 illustrates a radial signal intensity distribution for the via of FIGS. 13A and 13B with a model fitting curve.
Figure 13A:
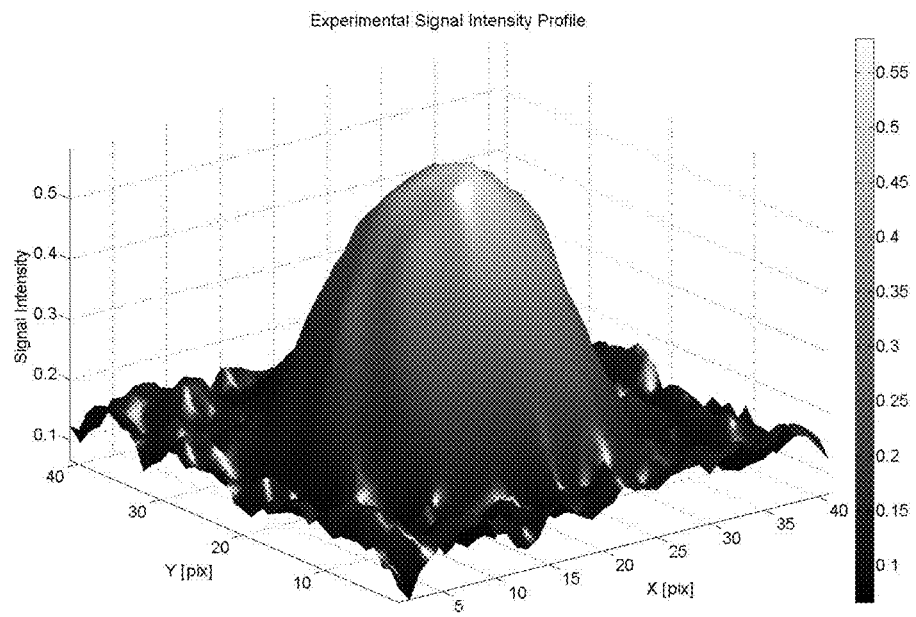
FIGS. 13A and 13B illustrate a 3D signal intensity profile and a signal strength via map from experimental data for a via.
Figure 13B:
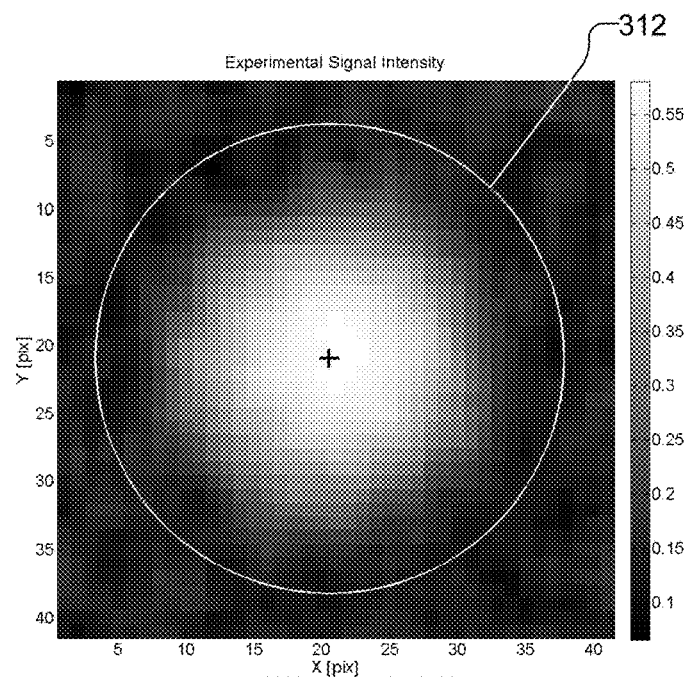
Figure 14A:
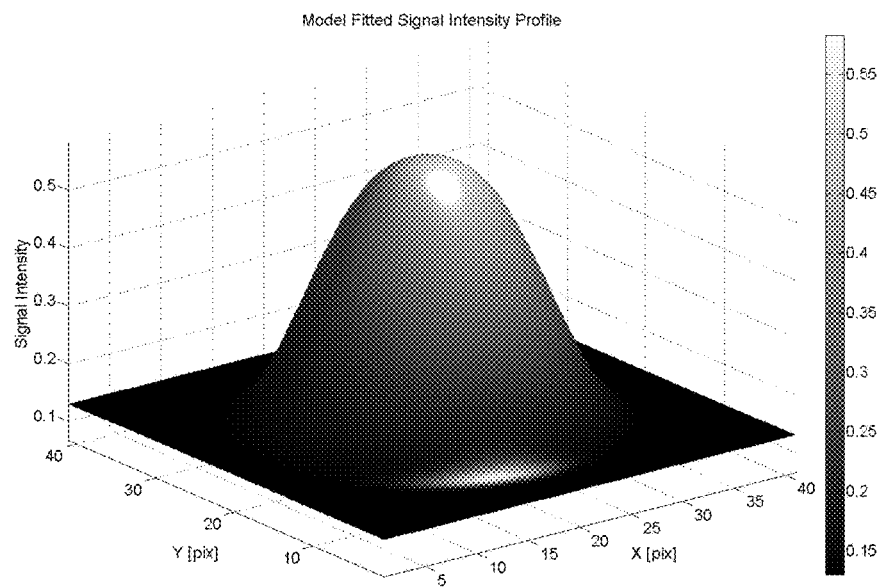
FIGS. 14A and 14B illustrate a 3D signal intensity profile and a signal strength via map for model fitting results for the via from FIGS. 13A and 13B.
Figure 14B:
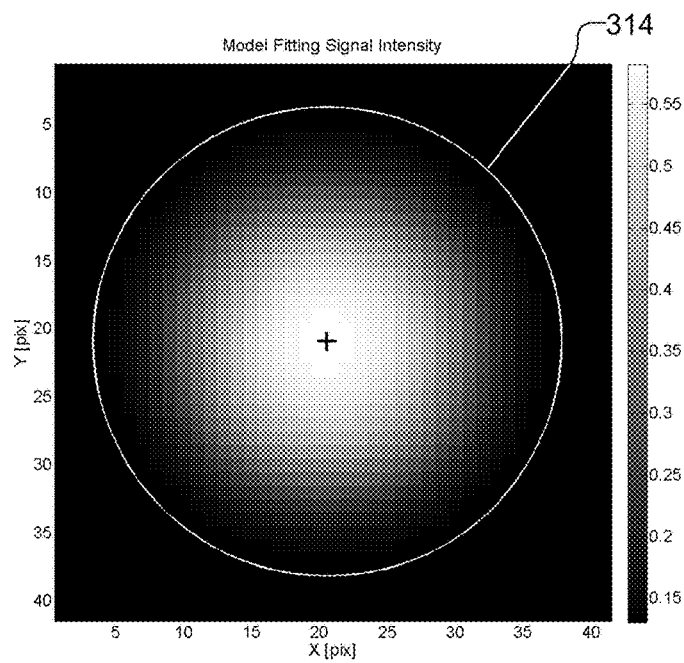

By way of example, FIG. 13A illustrates a 3D signal intensity profile and FIG. 13B illustrates a signal strength via map from experimental data for a via with a nominal top critical dimension of 11 μm and a depth of 105 μm, with a fitted BCD circle 312, which is 10.44 μm. FIG. 14A illustrates a 3D signal intensity profile and FIG. 14B illustrates a signal strength via map for model fitting results for the via from FIGS. 13A and 13B, where the circle 314 is the fitted BCD for the via. FIG. 15 illustrates a radial signal intensity distribution for the via with a model fitting curve 316. The use of model fitting 236 to determine the BCD 242 for each via is particularly useful as it allows extrapolation of the profile where the signal strength falls below the system noise floor close to the edge of the via bottom.

Figure 16:
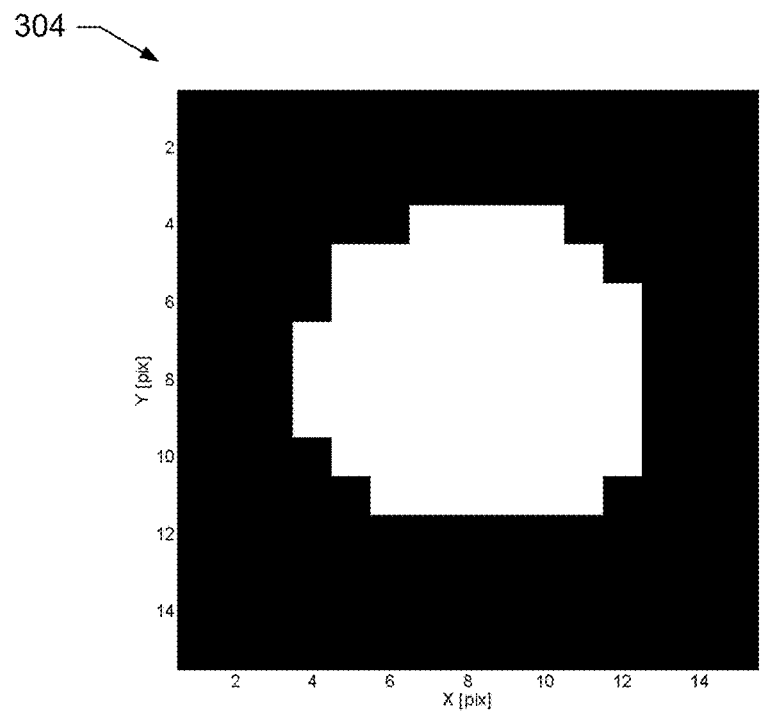
FIG. 16 illustrates a map of valid signals for a via.

Additionally, or alternatively, the signal strength via map 238 for the via may be used to perform an area analysis of the via based on a threshold that is based on the statistical properties for the individual via. For example, for each via, a histogram distribution of the strength in the signal strength via map may be generated. The histogram is treated as a bimodal distribution of gray scale values, consisting of signal and noise, and thus, a conventional image thresholding method, such as "Otsu's method" may be used to separate the signal class from the noise class, based on a threshold that minimizes the variances of each class of the distribution. Thus, noise is reduced in the signal strength via map for each individual via using a threshold that is generated from the statistical properties of the signal strength data of each individual via, e.g., from the variance of the modes in the distribution, resulting in a map of valid signals 244 for each via. FIG. 16, by way of example, illustrates a map 306 of valid signals for a via. The map 306 of the valid signals may be considered a mask that identifies pixels from the bottom of the via, and thus, may be used to determine the BCD of the via.

The map of valid signals 244 for each via may be used to determine the BCD 248 for each via using blob counting 246, which may be particularly advantageous, e.g., when the radius of the BCD is smaller than the optical resolution of the metrology device. Blob counting 246 converts the pixels associated with valid signals, which are the pixels from the bottom surface area of the via, into a BCD. For example, during the via detection 207, the location of the via is determined, providing the central coordinates for the via. A predetermined geometric figure, such as a circle, positioned around the central coordinates for the via may be determined as an area equivalent to the area of valid pixels in the map of valid signals. If desired, other methods or geometric figures may be used for determining the BCD, such as an ellipse that is a best fit to the perimeter of the valid pixels in the map of valid signals. The width of the predetermined geometric figure, e.g., a diameter of the circle or the average of the diameters of an ellipse, may be used as the BCD 248 for the via.

Figure 17:
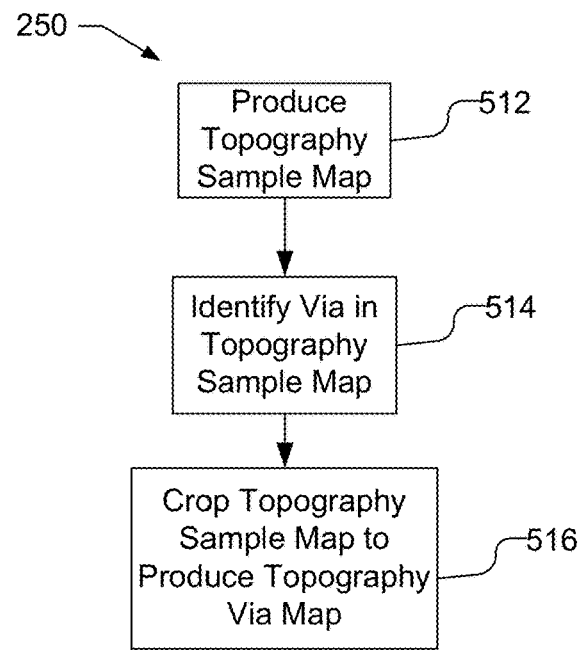
FIG. 17 is a flow chart illustrating a method of generating the topography via map.
Figure 18:
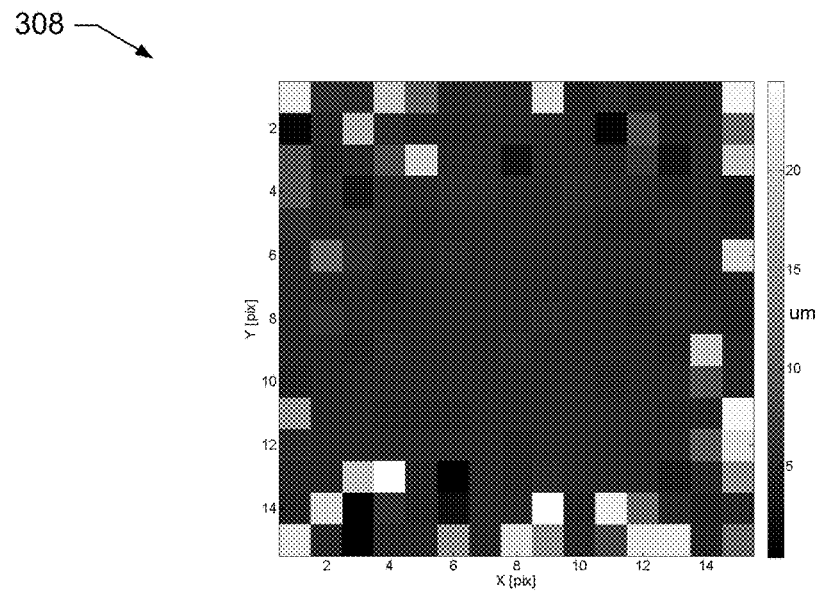
FIG. 18 illustrates a topography via map for an individual via.

Additionally, a topography (e.g., phase) via map 250 for the via may be generated using the refined height and signal strength data, wherein the topography via map includes height data for only one via. The topography via map 250 for the via to be measured may be generated based on the height information in the refined height and signal strength data, e.g., by cropping a topography sample map for the sample, similar to the signal strength via map 238, discussed above. For example, as illustrated in FIG. 17, a method of generating the topography via map 250 may include producing a topography sample map 512 for the frame of view of the sample or the entire sample using the height information from the refined height and signal strength data, such as that shown in FIG. 7. The via is identified in the topography sample map 514, e.g., using the location determined during via detection 207, and the via is cropped from the topography sample map to generate the topography via map for the via 516. FIG. 18, by way of example, illustrates a topography via map 308 for one via. The topography sample map may be cropped so that some pixels surrounding the via are included to ensure the entire via is included in the topography via map. If desired, the topography via map 238 for the via may be generated directly from the height information in the refined height and signal strength data based on the determined location of the via, without first generating the topography sample map for the sample.

The topography via map 238 may be used to determine physical characteristics of the via, such a depth 270 of each via. As illustrated, for each via, the topography via map 250 may be used to generate a bottom surface topography map 252. If desired, as illustrated with a dotted line in FIG. 5, the map of valid signals 244 may be used to assist in the generation of the bottom surface topography map 252, e.g., by identifying noise pixels in the topography via map 250 that are excluded in the generation of the bottom surface topography map 252. Using the bottom surface topography map 252, from which a leveled bottom surface 254 is generated. With the leveled bottom surface 254 generated, the depth of each via may be determined relative to a leveled top surface 270. The leveled top topography surface 270 may be generated in a conventional fashion, e.g., by generating height information 262 from interferometric data 260 for the top surface of the sample, i.e., the top of the vias. The height information may be generated, e.g., by modeling to a correlation function with the system characteristic reference data 203, model in the Fourier domain, etc., as discussed above. A top surface topography map 264 may be generated based on the height information 262. The plane is removed 268, e.g., based on a fitted plane of the top surface 269, and the leveled top surface 270 is generated. For example, the top surface may be assumed to be planar, and a best fit plane may be generated for that surface and subtracted, which should leave the surface level, and at "zero" height. The same fitted plane may be removed 253 from the bottom surface topography map 252 to produce the leveled bottom surface 254. Thus, the resulting leveled bottom surface 254 of the via is referenced to leveled top surface 270 to determine the depth 272 of the via.

Figure 19:
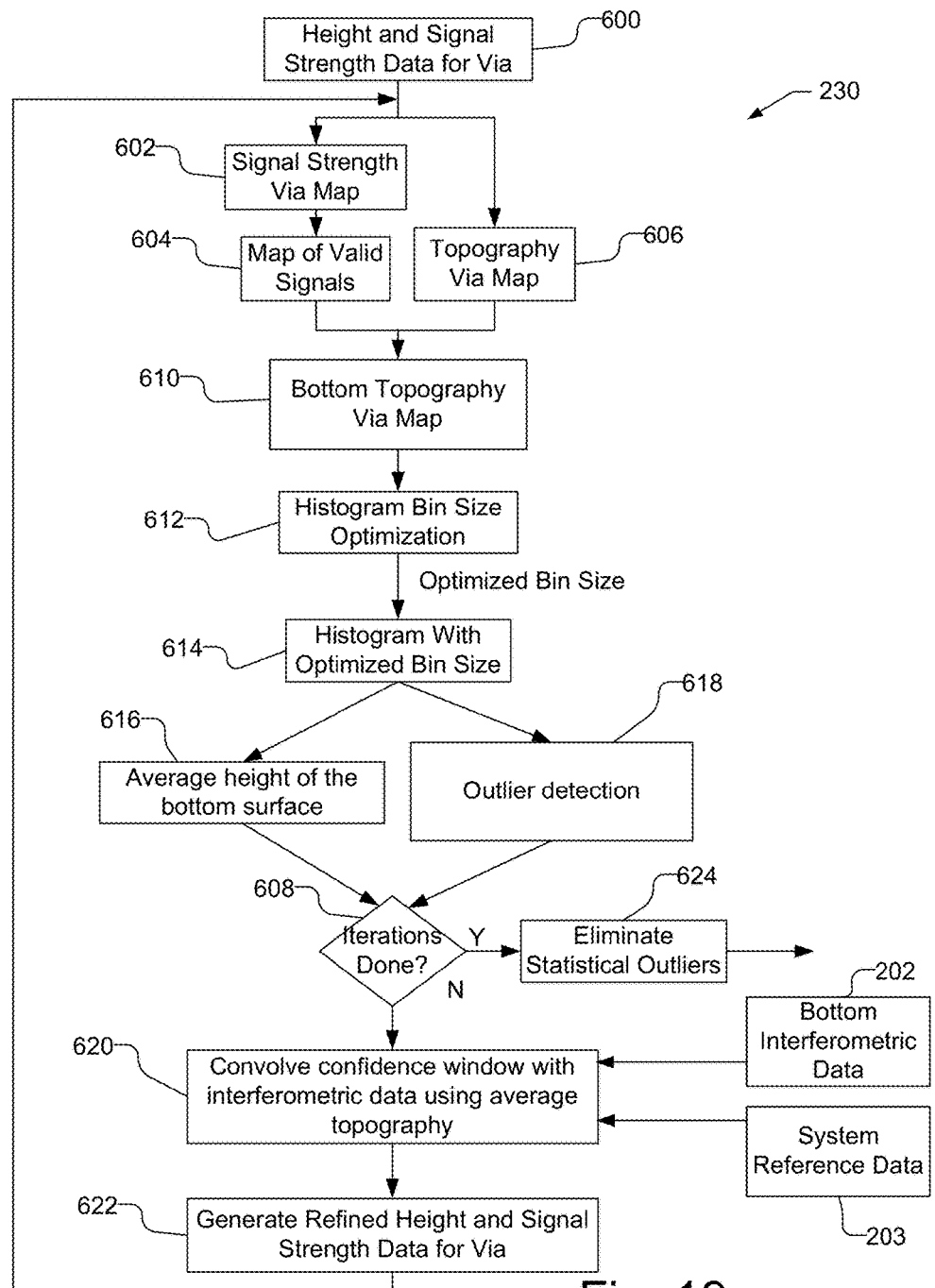
FIG. 19 is a flow chart illustrating a method of refining the height and signal strength data using height information.

FIG. 19, by way of example, illustrates one method implementing the refinement process 230, in which a topography via map and a map of valid signals are used to determine statistical properties of the height and signal strength data. As illustrated in FIG. 19, a signal strength via map 602, a map of valid signals 604, and a topography via map 606 are generated from height and signal strength data for a via 600. The height and signal strength data for the via 600 may be an unrefined height and signal strength data for the via generated from the interferometric data 202 prior to implementation of the refinement process. Combining the map of valid signals 604, the topography via map 606, the bottom topography via map 610 may be produced, which only contains the pixels with valid signals and stores the height information in each pixel. A histogram of bottom topography with optimized bin size may be obtained, from which the average height of the bottom surface can be determined, and the outlier detection process 618 may detect the outliers. The process may be repeated 608 until no further improvements are obtained or for a set number of iterations. Moreover, if desired, the refinement process may be skipped, e.g., there are 0 iterations 608, and the signal strength via map 602, map of valid signals 604, and topography via map 606 based on unrefined height and signal strength data may be used to determine the desired physical characteristics of the via, e.g., by model fitting the signal strength via map 602 as discussed above. When the process needs to repeat, the bottom interferometric data 202 and the system reference data 203 may be used to generate the refined height and signal strength data for via 622, by convolving a pre-defined confidence window whose location is set to the updated average height of the bottom surface 616. If the refinement iteration is done, a refined bottom topography via map may be obtained with more accurate height information.

Figure 20:
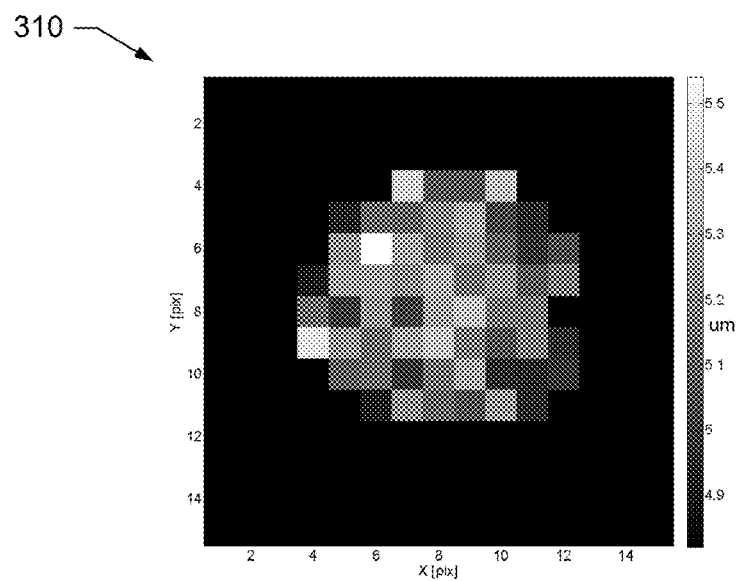
FIG. 20 illustrates a bottom topography via map for a via in which noise pixels have been eliminated.

In the present implementation, to determine statistical properties of the height and signal strength data, a bottom topography via map 610 may be generated using the map of valid signals 604 and the topography via map 606. FIG. 20, for example, illustrates a bottom topography via map 310, which may be produced using the map of valid signals 304 (FIG. 16) as a mask to exclude noise pixels in the topography via map 308 (FIG. 18). A histogram of the bottom topography via map 610 may be produced and the optimized bin size determined 612. During optimization, it is desired to minimize an expected loss function between the histogram and an unknown underlying density function. Thus, a search is performed for the optimal bin size that minimizes the estimated Mean Integrated Squared Error (MISE), which is a measure of the goodness-of-the-fit of a histogram to the unknown density function. A histogram with a bin size that minimizes the MISE is optimal. The MISE function may be estimated by:

$$C(\Delta) = \frac{2k - v}{\Delta^2}. \qquad \text{eq. 3}$$

Where the search is to find the bin size $\Delta^*$ that minimizes $C(\Delta)$, and where the mean k and variance v of the number of events are:

$$k \equiv \frac{1}{N}\sum_{i=1}^{N} k_i; \quad v \equiv \frac{1}{N}\sum_{i=1}^{N}(k_i - k)^2. \qquad \text{eq. 4}$$

where $\{k_i\}_{i=1, 2, \ldots N}$ is the array of the data set.

Figure 21:
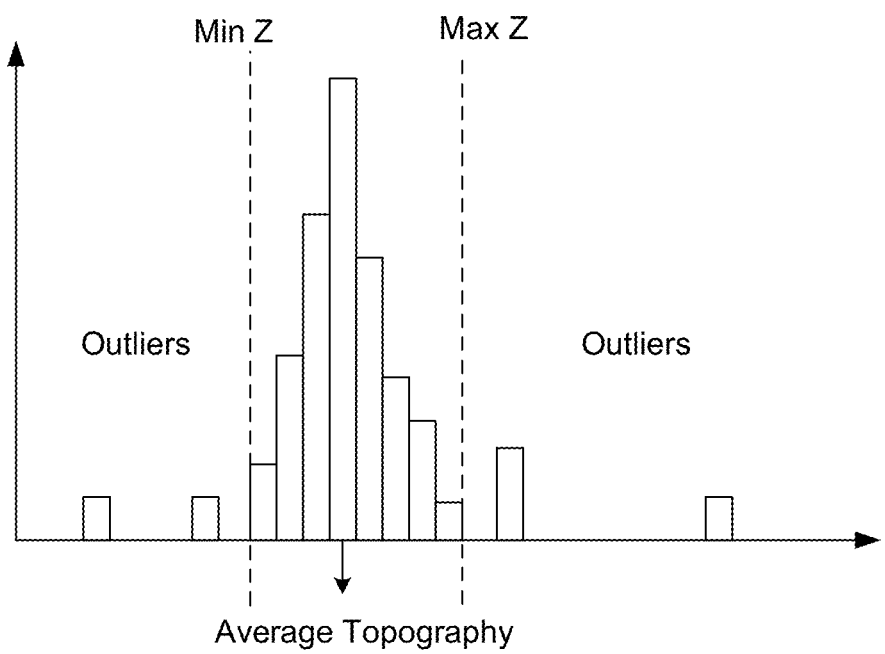
FIG. 21 illustrates a histogram of topography (Z height) with an optimized bin size.

A histogram of the bottom topography via map is then generated with the optimized bin size 614. The average height of the bottom surface from the via is determined 616 thereby providing a statistical property of the height and signal strength data. FIG. 21, by way of example, illustrates a histogram of topography (Z height) with an optimized bin size for a via. The height may be determined from the histogram, e.g., from the bar in the histogram having the highest count. If desired, a minimum height (Min Z) and a maximum height (Max Z) may be determined as the left and right histogram boundaries of a cluster around the average height bar, e.g., by finding neighboring bar counts that are 0. If desired, outlier pixels may be determined 618, e.g., as any pixel associated with a histogram bar that is outside the Min Z to Max Z range.

As illustrated in FIG. 19 (as well as with dotted lines in FIG. 5), the process may be repeated 608 until no further improvements are obtained or for a set number of iterations, and statistical outliers are eliminated 624. Moreover, if desired, the refinement process may be skipped, e.g., there are 0 iterations 608, and the signal strength via map 602, map of valid signals 604, and topography via map 606 based on unrefined height and signal strength data may be used to determine the desired physical characteristics of the via, e.g., by model fitting the signal strength via map 602 as discussed above.

As discussed above, noise may be removed from the height and signal strength data for the via using the determined statistical properties, e.g., by convolving a confidence window with the interferometric data 202 for all or a subset of pixels 620 to produce refined interferometric data, as discussed above. As discussed above, the confidence window may be a boxcar function of a fixed width that is centered on the region of the trace associated with the average height. The confidence window may have other forms, for example, a smoothly varying function such as a normal distribution, or a distribution that reflects an expected curvature of the bottom surface (which would affect the height distribution). If a confidence window having a boxcar function is used, only interferometric data for outlier pixels may be convolved with the confidence window, as the boxcar function will not alter the determined height for any inlier pixels. The refined height and signal strength data may thus be determined 622 from the refined interferometric data. Alternatively, as discussed above, the confidence window may be convolved directly with the height and signal strength data 600 for the via to produce the refined height and signal strength data.

As illustrated, the refined height and signal strength data is used to determine a signal strength via map 602, a map of valid signals 604, and a topography via map 606 and the process repeats until all iterations are completed 608 or no more outliers are detected. If desired, statistical outliers of the map of valid signals 604, and the topography via map 606 may be eliminated 624 after the last iteration, e.g., by identifying outlier pixels, as discussed in 618, and removing outlier pixels.

Figure 22:
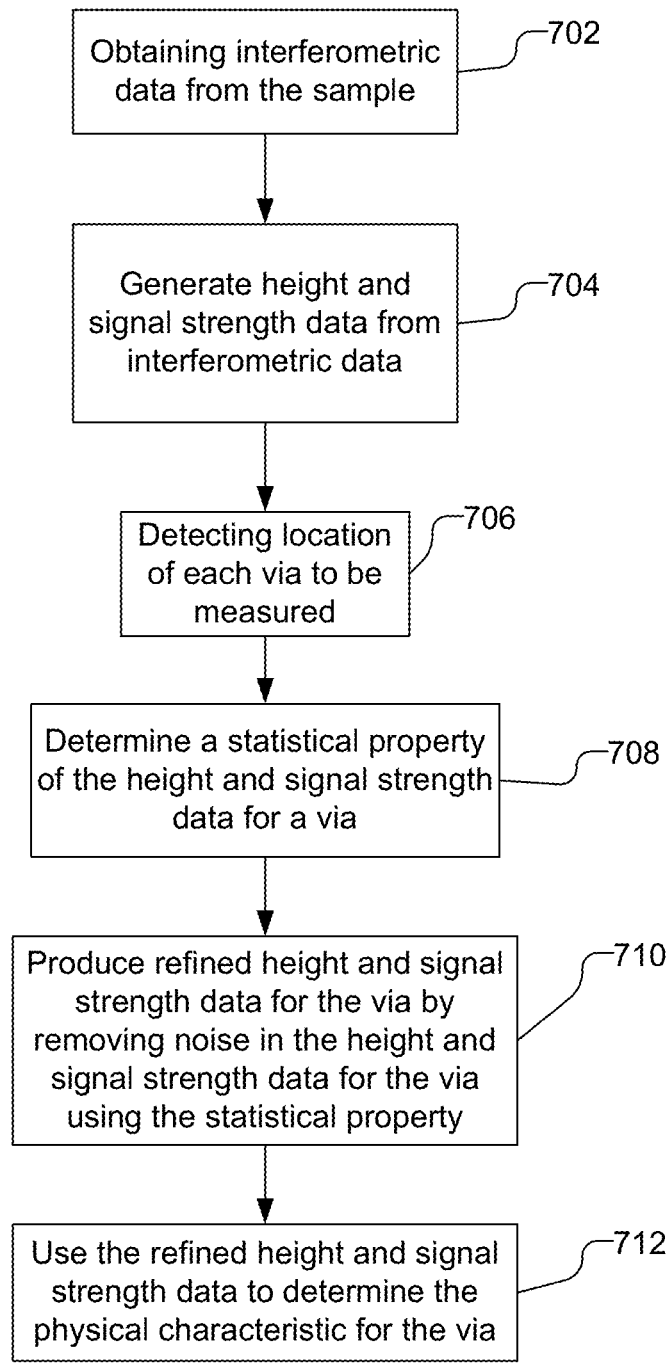
FIG. 22 illustrates method of determining a physical characteristic of at least one via in a sample.

FIG. 22 illustrates a method of determining a physical characteristic of at least one via in a sample that may be employed by the optical metrology device 100, e.g., with a processor 27 configured to perform the various function. As illustrated in FIG. 22, interferometric data is obtained from the sample 702. As discussed above, height information and signal strength data is generated from the interferometric data 704, e.g., modeling a correlation function with a system characteristic reference data, modeling a Fourier transform, etc. A location of each via to be measured is detected 706, e.g., using a signal strength sample map, a topography map or an optical image of the sample. A statistical property of the height and signal strength data for a via is determined 708, e.g., as discussed in FIG. 5 and FIG. 19. A refined height and signal strength data for the via may be generated by removing noise in the height and signal strength data for the via using the statistical property 710, e.g., as discussed in FIG. 5 and FIG. 19. The physical characteristic for the via is determined using the refined height and signal strength data 712, as discussed above. For example, the physical characteristic may be the BCD and/or depth for the via, as well as any other desired parameter, e.g., curvature and roughness. In one implementation, an iterative process is used, e.g., iteratively determining the statistical property of the refined height and signal strength data for the via are and producing the refined height and signal strength data for the via before using the refined height and signal strength data to determine the physical characteristic for the via.

The statistical property of the height and signal strength data for the via may be, e.g., an average height for the via. For example, a topography via map for the via may be generated using the height and signal strength data, wherein the topography via map includes height data for only one via, wherein the average height for the via is determined using the topography via map. The topography via map for the via may be generated, e.g., by generating a topography sample map for the sample using the height and signal strength data; and cropping the via from the topography sample map to produce the topography via map. Moreover, a signal strength via map for the via may be generated based on the height and signal strength data, wherein the signal strength via map includes signal strength data for only one via; and a map of valid signals for the via may be produced using the signal strength via map and a threshold that is based on statistical properties of the signal strength via map for the via, and the average height for the via is further determined using the map of valid signals.

The noise in the height and signal strength data for the via may be removed using the statistical property by producing a convolution of a confidence window with the height and signal strength data for the via based on the statistical property. For example, the convolution of the confidence window with the height and signal strength data for the via based on the statistical property may be produced by convoluting the confidence window with the interferometric data for the via to produce refined interferometric data for the via and generating the refined height and signal strength data for the via from the refined interferometric data for the via. Alternatively, the convolution of the confidence window with the height and signal strength data for the via based on the statistical property may be produced by convoluting the confidence window with the height and signal strength data for the via. For example, the confidence window may be at least one of a boxcar function with a fixed width or a varying function. The convolution of the confidence window with the height and signal strength data for the via based on the statistical property may be produced for every pixel in the interferometric data for the via or a subset of pixels in the interferometric data for the via.

It should be understood that the process may be performed for multiple vias, e.g., by generating the statistical property of the height and signal strength data for each via or all vias in a plurality of vias; generating refined height and signal strength data for each via by removing noise in the height and signal strength data for each via using the statistical property of the height and signal strength data for each via or all vias; and using the refined height and signal strength data for each via to determine the physical characteristic for each via.

The physical characteristic of the via may be the BCD. For example, the refined height and signal strength data may be used to determine the BCD for the via by generating a signal strength via map for the via based on the refined height and signal strength data, wherein the signal strength via map includes signal strength data for only one via; and calculating the BCD for the via using the signal strength via map. The signal strength via map for a via may be generated, e.g., by generating a signal strength sample map for the sample using the height and signal strength data; and cropping the via from the signal strength sample map to produce the signal strength via map. Calculating the BCD for the via using the signal strength via map may be performed by, e.g., fitting the signal strength via map to a model to determine the BCD for the via. Additionally or alternatively, calculating the BCD for the via using the signal strength via map may be performed by producing a map of valid signals for the via using the signal strength via map and a threshold that is based on statistical properties of the signal strength via map for the via; and calculating the BCD for the via using the map of valid signals. For example, the bottom area pixels of the map of valid signals may be converted into a circle and the diameter of the circle may be used as the BCD for the via.

The physical characteristic of the via may be the depth of the via, e.g., where the process includes generating a topography via map for the via using the refined height and signal strength data, wherein the topography via map includes height data for only one via and determining the depth of the via determined using the topography via map. For example, the interferometric data may be a first set of interferometric data from a bottom surface of the via, where the process includes determining the depth of the via using the topography via map by obtaining a second set of interferometric data from a top surface of the sample; generating height and signal strength data for the top surface of the sample from the second set of interferometric data; generating a top surface topography map for the top surface of the sample using the height and signal strength data for the top surface of the sample; determining a leveled top surface from the top surface topography map; generating a bottom surface topography map for the bottom surface of the via using the topography via map; determining a leveled bottom surface from the bottom surface topography map; and determining the depth of the via using the leveled bottom surface and the leveled top surface.

Figure 23:
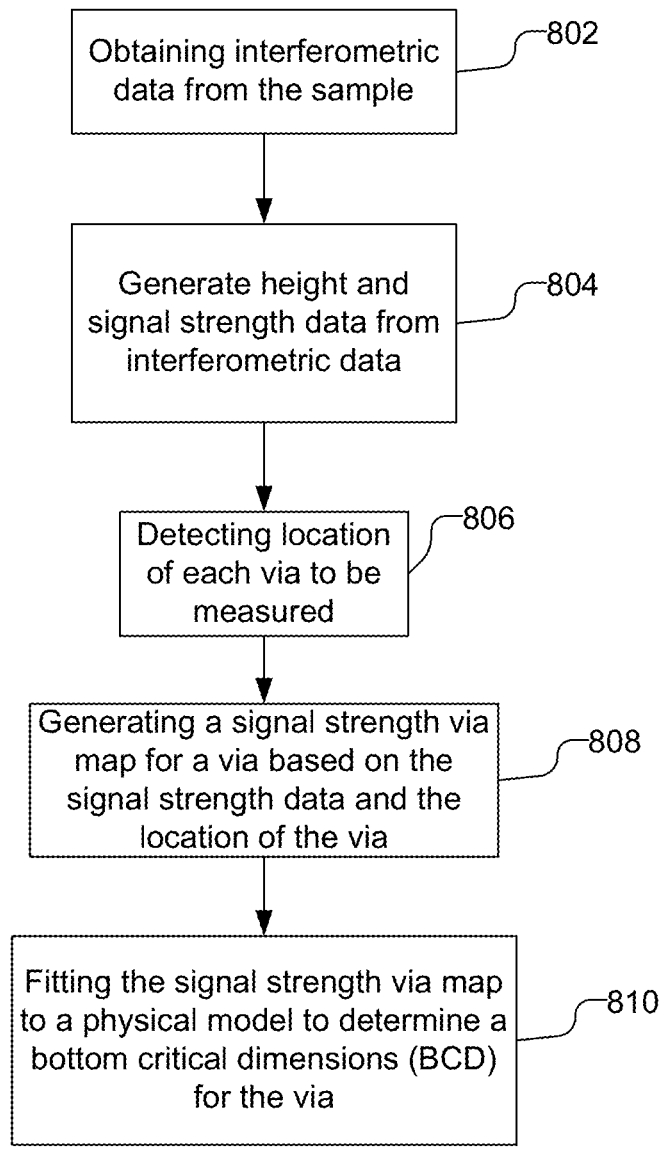
FIG. 23 illustrates another method of determining a physical characteristic of at least one via in a sample.

FIG. 23 illustrates a method of determining a physical characteristic of at least one via in a sample that may be employed by the optical metrology device 100, e.g., with a processor 27 configured to perform the various function. As illustrated in FIG. 23, interferometric data is obtained from the sample 802. As discussed above, height information and signal strength data is generated from the interferometric data 804, e.g., modeling a correlation function with a system characteristic reference data, modeling a Fourier transform, etc. A location of each via to be measured is detected 806, e.g., using a signal strength sample map, a topography map or an optical image of the sample. A signal strength via map for a via is generated based on the signal strength data and the location of the via 808. The signal strength via map includes signal strength data for only one via. The signal strength via map may be fit to a model to determine a bottom critical dimensions (BCD) for the via 810.

Figure 24:
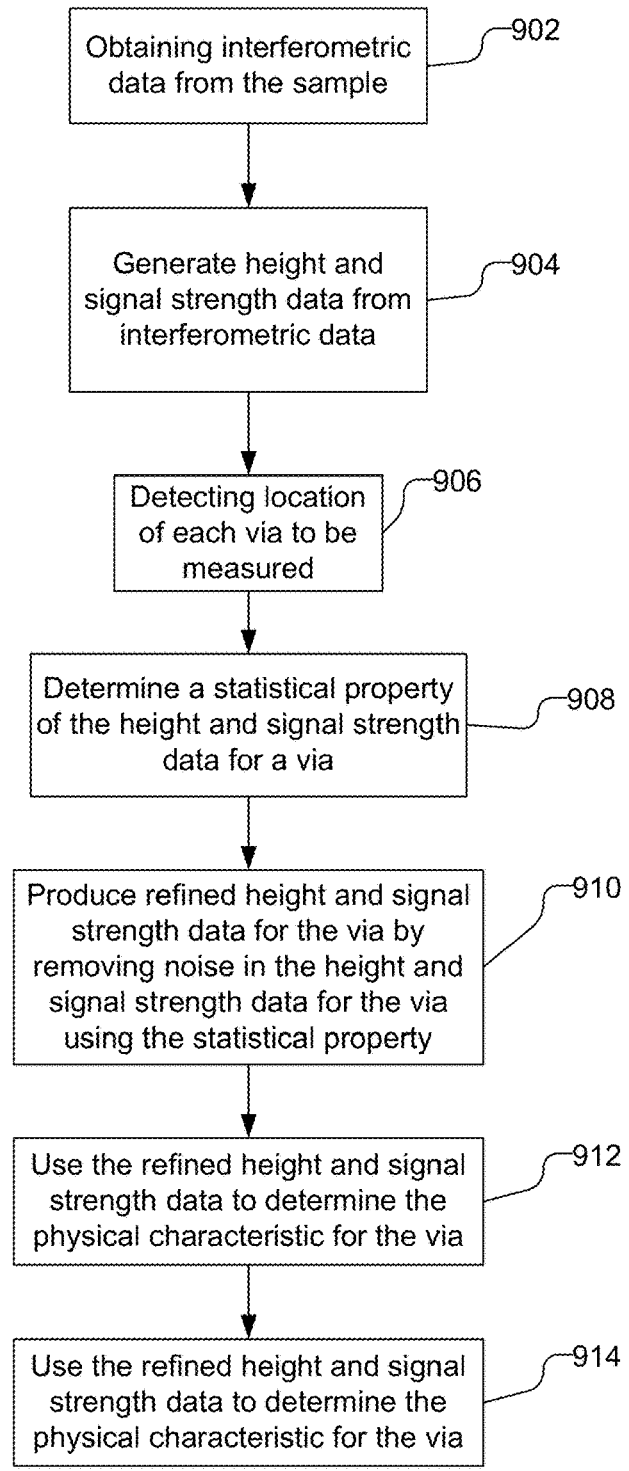
FIG. 24 illustrates another method of determining a physical characteristic of at least one via in a sample.

FIG. 24 illustrates a method of determining a physical characteristic of at least one via in a sample that may be employed by the optical metrology device 100, e.g., with a processor 27 configured to perform the various function. As illustrated in FIG. 24, interferometric data is obtained from the sample 902. As discussed above, height information and signal strength data is generated from the interferometric data 904, e.g., modeling a correlation function with a system characteristic reference data, modeling a Fourier transform, etc. A location of each via to be measured is detected 906, e.g., using a signal strength sample map, a topography map or an optical image of the sample. A statistical property of the height and signal strength data for a via is determined 908, e.g., as discussed in FIG. 5 and FIG. 19. A refined height and signal strength data for the via may be generated by removing noise in the height and signal strength data for the via using the statistical property 910, e.g., as discussed in FIG. 5 and FIG. 19. A signal strength via map for the via may be generated based on the refined height and signal strength data 912. The signal strength via map includes signal strength data for only one via. The physical characteristic for the via is determined using the signal strength via map 914, as discussed above. For example, the physical characteristic may be the BCD and/or depth for the via, as well as any other desired parameter, e.g., curvature and roughness. For example, the physical characteristic for the via may be BCD determined by fitting the signal strength via map to a model. Alternatively or additionally, the BCD may be determined by producing a map of valid signals for the via using the signal strength via map and a threshold that is based on statistical properties of the signal strength via map for the via; and calculating the BCD using the map of valid signals, e.g., by converting a bottom area pixels of the map of valid signals into a circle; and using a diameter of the circle as the BCD for the via.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A method of determining a physical characteristic of at least one via in a sample, the method comprising:
    obtaining, using an interferometer interferometric data from the sample for a plurality of pixels in at least a frame of view of the sample;
    generating, with a processor implementing instructions from a non-transitory computer usable storage medium, surface height and signal strength data from the interferometric data, wherein the surface height and signal strength data comprises surface height with respect to signal strength for each pixel in the at least the frame of view of the sample, wherein surface heights for the pixels in the plurality of pixels provides a topography of a surface of the sample in the at least the frame of view of the sample;
    detecting, with a processor implementing instructions from a non-transitory computer usable storage medium, a location of each via to be measured in the at least the frame of view of the sample;
    determining, with a processor implementing instructions from a non-transitory computer usable storage medium, a surface height related statistical property for a via using the surface height and signal strength data for a plurality of pixels in the via;
    producing, with a processor implementing instructions from a non-transitory computer usable storage medium, refined surface height and signal strength data for pixels in the via by removing noise in the surface height and signal strength data for the pixels in the via using the surface height related statistical property for the via; and
    using, with a processor implementing instructions from a non-transitory computer usable storage medium, the refined surface height and signal strength data to determine the physical characteristic for the via.

2. The method of claim 1, further comprising iteratively generating the surface height related statistical property of the refined surface height and signal strength data for the plurality of pixels in the via and producing the refined surface height and signal strength data for the pixels in the via before using the refined surface height and signal strength data to determine the physical characteristic for the via.

3. The method of claim 1, wherein the surface height related statistical property for the via comprises an average surface height for the via.

4. The method of claim 3, further comprising:
    generating a topography via map for the via using the surface height and signal strength data, wherein the topography via map includes surface height data for only one via;
    wherein the average surface height for the via is determined using the topography via map.

5. The method of claim 4, wherein generating the topography via map for the via using the surface height and signal strength data comprises:
    generating a topography sample map for the sample using the surface height and signal strength data; and
    cropping the via from the topography sample map to produce the topography via map.

6. The method of claim 4, further comprising:
    generating a signal strength via map for the via based on the surface height and signal strength data, wherein the signal strength via map includes signal strength data for only one via;
    producing a map of valid signals for the via using the signal strength via map and a threshold that is based on statistical properties of the signal strength via map for the via;
    wherein the average surface height for the via is further determined using the map of valid signals.

7. The method of claim 1, wherein removing noise in the surface height and signal strength data for the pixels in the via using the surface height related statistical property for the via comprises producing a convolution of a confidence window with the surface height and signal strength data for the pixels in the via based on the surface height related statistical property.

8. The method of claim 7, wherein producing the convolution of the confidence window with the surface height and signal strength data for the pixels in the via based on the surface height related statistical property comprises convoluting the confidence window with the interferometric data for the via to produce refined interferometric data for the via and generating the refined surface height and signal strength data for the pixels in the via from the refined interferometric data for the via.

9. The method of claim 7, wherein producing the convolution of the confidence window with the surface height and signal strength data for the pixels in the via based on the surface height related statistical property comprises convoluting the confidence window with the surface height and signal strength data for the pixels in the via.

10. The method of claim 7, wherein the confidence window comprises a boxcar function with a fixed width or a varying function.

11. The method of claim 7, wherein the convolution of the confidence window with the surface height and signal strength data for the pixels in the via based on the surface height related statistical property is produced for every pixel in the interferometric data for the via or a subset of pixels in the interferometric data for the via.

12. The method of claim 1, further comprising:
generating the surface height related statistical property for each via or all vias in a plurality of vias;
generating refined surface height and signal strength data for pixels in each via by removing noise in the surface height and signal strength data for the pixels in each via using the surface height related statistical property for each via or all vias;
using the refined surface height and signal strength data for each via to determine the physical characteristic for each via.

13. The method of claim 1, wherein the physical characteristic is a bottom critical dimensions (BCD) for the via.

14. The method of claim 13, wherein using the refined surface height and signal strength data to determine the BCD for the via comprises:
generating a signal strength via map for the via based on the refined surface height and signal strength data, wherein the signal strength via map includes signal strength data for only one via; and
calculating the BCD for the via using the signal strength via map.

15. The method of claim 14, wherein generating the signal strength via map for the via comprises:
generating a signal strength sample map for the sample using the surface height and signal strength data; and
cropping the via from the signal strength sample map to produce the signal strength via map.

16. The method of claim 14, wherein calculating the BCD for the via using the signal strength via map comprises:
fitting the signal strength via map to a model to determine the BCD for the via.

17. The method of claim 14, wherein calculating the BCD for the via using the signal strength via map comprises:
producing a map of valid signals for the via using the signal strength via map and a threshold that is based on statistical properties of the signal strength via map for the via; and
calculating the BCD for the via using the map of valid signals.

18. The method of claim 17, wherein calculating the BCD for the via using the map of valid signals comprises:
converting bottom area pixels of the map of valid signals into a predetermined geometric figure;
using a width of the predetermined geometric figure as the BCD for the via.

19. The method of claim 1, further comprising:
generating a topography via map for the via using the refined surface height and signal strength data, wherein the topography via map includes surface height data for only one via;
wherein the physical characteristic is a depth of the via determined using the topography via map.

20. The method of claim 19, wherein obtaining the interferometric data from the sample comprises:
obtaining a first set of interferometric data from a bottom surface of the via, wherein the bottom surface of the via is the surface of the sample at a bottom of the via;
wherein determining the depth of the via using the topography via map comprises:
obtaining a second set of interferometric data from a top surface of the sample, wherein the top surface of the sample is the surface of the sample at the top of the sample;
generating surface height and signal strength data for the top surface of the sample from the second set of interferometric data;
generating a top surface topography map for the top surface of the sample using the surface height and signal strength data for the top surface of the sample;
determining a leveled top surface from the top surface topography map;
generating a bottom surface topography map for the bottom surface of the via using the topography via map;
determining a leveled bottom surface from the bottom surface topography map;
determining the depth of the via using the leveled bottom surface and the leveled top surface.

21. The method of claim 20, further comprising:
determining a fitted plane from the top surface topography map for the top surface;
wherein determining the leveled top surface from the top surface topography map comprises removing the fitted plane from the top surface topography map to produce the leveled top surface; and
wherein determining the leveled bottom surface from the bottom surface topography map comprises removing the fitted plane from the bottom surface topography map to produce the leveled bottom surface.

22. A method of determining a physical characteristic of at least one via in a sample, the method comprising:
obtaining, using an interferometer, interferometric data from the sample for a plurality of pixels in at least a frame of view of the sample;
generating, with a processor implementing instructions from a non-transitory computer usable storage medium, surface height and signal strength data from the interferometric data, wherein the surface height and signal strength data comprises surface height with respect to signal strength for each pixel in the at least the frame of view of the sample, wherein surface heights for the pixels in the plurality of pixels provides a topography of a surface of the sample in the at least the frame of view of the sample;
detecting, with a processor implementing instructions from a non-transitory computer usable storage medium, a location of each via to be measured in the at least the frame of view of the sample;
generating, with a processor implementing instructions from a non-transitory computer usable storage medium, a signal strength via map for a via based on the signal strength data and the location of the via, wherein the signal strength via map includes signal strength data for only one via; and fitting, with a processor implementing instructions from a non-transitory computer usable storage medium, the signal strength via map to a model to determine a bottom critical dimensions (BCD) for the via.

23. The method of claim 22, further comprising:

generating a plurality of signal strength via maps for a plurality of vias based on the signal strength data and locations of the plurality of vias, wherein each of the plurality of signal strength via maps includes signal strength data for only one via; and fitting each of the plurality of signal strength via maps to the model to determine the BCD for each via of the plurality of vias.

24. The method of claim 22, further comprising:

generating a surface height related statistical property of the surface height and signal strength data for the via;

producing refined surface height and signal strength data for the via by removing noise in the surface height and signal strength data for the via using the surface height related statistical property;

wherein the signal strength via map for a via is generated using the refined surface height and signal strength data.

25. The method of claim 24, wherein the surface height related statistical property comprises an average surface height for the via.

26. The method of claim 25, further comprising:

generating a topography via map for the via using the surface height and signal strength data, wherein the topography via map includes surface height data for only one via;

wherein the average surface height for the via is determined using the topography via map.

27. The method of claim 26, wherein generating the topography via map for the via using the surface height and signal strength data comprises:

generating a topography sample map for the sample using the surface height and signal strength data; and cropping the via from the topography sample map to produce the topography via map.

28. The method of claim 26, further comprising:

producing a map of valid signals for the via using the signal strength via map and a threshold that is based on statistical properties of the signal strength via map for the via;

wherein the average surface height for the via is further determined using the map of valid signals.

29. The method of claim 24, wherein removing noise in the surface height and signal strength data for the via using the surface height related statistical property comprises producing a convolution of a confidence window with the surface height and signal strength data for the via based on the surface height related statistical property.

30. The method of claim 29, wherein producing the convolution of the confidence window with the surface height and signal strength data for the via based on the surface height related statistical property comprises convoluting the confidence window with the interferometric data for the via to produce refined interferometric data for the via and generating the refined surface height and signal strength data for the via from the refined interferometric data for the via.

31. The method of claim 29, wherein producing the convolution of the confidence window with the surface height and signal strength data for the via based on the surface height related statistical property comprises convoluting the confidence window with the surface height and signal strength data for the via.

32. The method of claim 29, wherein the confidence window comprises a boxcar function with a fixed width or a varying function.

33. The method of claim 29, wherein the convolution of the confidence window with the surface height and signal strength data for the via based on the surface height related statistical property is produced for every pixel in the interferometric data for the via or a subset of pixels in the interferometric data for the via.

34. A method of determining a physical characteristic of at least one via in a sample, the method comprising:

obtaining, using an interferometer, interferometric data from the sample for a plurality of pixels in at least a frame of view of the sample;

generating, with a processor implementing instructions from a non-transitory computer usable storage medium, surface height and signal strength data from the interferometric data, wherein the surface height and signal strength data comprises surface height with respect to signal strength for each pixel in the at least the frame of view of the sample, wherein surface heights for the pixels in the plurality of pixels provides a topography of a surface of the sample in the at least the frame of view of the sample;

detecting, with a processor implementing instructions from a non-transitory computer usable storage medium, a location of each via to be measured in the at least the frame of view of the sample;

generating, with a processor implementing instructions from a non-transitory computer usable storage medium, a surface height related statistical property for a via using the surface height and signal strength data for a plurality of pixels in the via;

producing, with a processor implementing instructions from a non-transitory computer usable storage medium, refined surface height and signal strength data for pixels in the via by removing noise in the surface height and signal strength data for the pixels in the via using the surface height related statistical property for the via;

generating, with a processor implementing instructions from a non-transitory computer usable storage medium, a signal strength via map for the via based on the refined surface height and signal strength data, wherein the signal strength via map includes signal strength data for only one via; and determining, with a processor implementing instructions from a non-transitory computer usable storage medium, a physical characteristic for the via using the signal strength via map.

35. The method of claim 34, wherein determining the physical characteristic for the via using the signal strength via map comprises:

fitting the signal strength via map to a model to determine a bottom critical dimensions (BCD) for the via.

36. The method of claim 34, wherein determining the physical characteristic for the via using the signal strength via map comprises:

producing a map of valid signals for the via using the signal strength via map and a threshold that is based on statistical properties of the signal strength via map for the via; and calculating a bottom critical dimensions (BCD) for the via using the map of valid signals.

37. The method of claim 36, wherein calculating the BCD for the via using the map of valid signals comprises:
   converting bottom area pixels of the map of valid signals into a circle;
   using a diameter of the circle as the BCD for the via.

* * * * *